US012660594B2

(12) United States Patent
Wang et al.

(10) Patent No.: US 12,660,594 B2
(45) Date of Patent: Jun. 16, 2026

(54) CHIP PACKAGE STRUCTURE WITH SUBSTRATES AND METHOD FOR FORMING THE SAME

(71) Applicant: Taiwan Semiconductor Manufacturing Company, Ltd., Hsinchu (TW)

(72) Inventors: Chuei-Tang Wang, Taichung City (TW); Chung-Hao Tsai, Huatan Township, Changhua County (TW); Chen-Hua Yu, Hsinchu City (TW); Wei-Ting Chen, Tainan City (TW); Chia-Chia Lin, Kaohsiung City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 427 days.

(21) Appl. No.: 18/305,569

(22) Filed: Apr. 24, 2023

(65) Prior Publication Data

US 2024/0355771 A1 Oct. 24, 2024

(51) Int. Cl.
　　*H10W 20/42* (2026.01)
　　*H10W 74/15* (2026.01)
　　*H10W 90/00* (2026.01)

(52) U.S. Cl.
　　CPC ............ *H10W 20/42* (2026.01); *H10W 74/15* (2026.01); *H10W 90/732* (2026.01)

(58) Field of Classification Search
　　CPC ...................................................... H01L 24/32
　　See application file for complete search history.

(56) References Cited

U.S. PATENT DOCUMENTS

| | | | |
|---|---|---|---|
| 8,993,380 | B2 | 3/2015 | Hou et al. |
| 9,281,254 | B2 | 3/2016 | Yu et al. |
| 9,299,649 | B2 | 3/2016 | Chiu et al. |
| 9,372,206 | B2 | 6/2016 | Wu et al. |
| 9,425,126 | B2 | 8/2016 | Kuo et al. |
| 9,443,783 | B2 | 9/2016 | Lin et al. |
| 9,461,018 | B1 | 10/2016 | Tsai et al. |
| 9,496,189 | B2 | 11/2016 | Yu et al. |
| 9,666,502 | B2 | 5/2017 | Chen et al. |
| 9,735,131 | B2 | 8/2017 | Su et al. |
| 2022/0052006 | A1* | 2/2022 | Kang ...................... H01L 24/14 |

(Continued)

*Primary Examiner* — Mounir S Amer

(74) *Attorney, Agent, or Firm* — Birch, Stewart, Kolasch & Birch, LLP

(57) ABSTRACT

A method for forming a chip package structure is provided. The method includes providing a first substrate and a second substrate. The first substrate includes a first semiconductor base and a first bonding line over a front surface of the first semiconductor base, and the second substrate includes a second semiconductor base and a second bonding line over the second semiconductor base. The method includes bonding the second substrate to the first substrate. The first bonding line is in contact with the second bonding line. The method includes forming a conductive line over a back surface of the first semiconductor base. The conductive line is thicker than the first bonding line. The method includes forming a conductive bump over the back surface of the first semiconductor base. The conductive line is between the conductive bump and the first semiconductor base.

20 Claims, 18 Drawing Sheets

(56)      References Cited

U.S. PATENT DOCUMENTS

| 2023/0133116 A1* | 5/2023 | Jang | ......................... H01L 24/05 |
| | | | 257/774 |
| 2024/0063193 A1* | 2/2024 | Mun | ....................... H01L 25/50 |
| 2024/0413144 A1* | 12/2024 | Park | ......................... H01L 25/18 |

* cited by examiner

CHIP PACKAGE STRUCTURE WITH SUBSTRATES AND METHOD FOR FORMING THE SAME

BACKGROUND

Semiconductor devices are used in a variety of electronic applications, such as personal computers, cell phones, digital cameras, and other electronic equipment. These semiconductor devices are fabricated by sequentially depositing insulating or dielectric layers, conductive layers, and semiconductor layers over a semiconductor substrate, and patterning the various material layers using lithography and etching processes to form circuit components and elements on the semiconductor substrate.

The semiconductor industry continues to improve the integration density of various electronic components (e.g., transistors, diodes, resistors, capacitors, etc.) by continual reductions in minimum feature size, which allow more components to be integrated into a given area. These smaller electronic components also use a smaller package that takes up less area or has a lower height, in some applications.

New packaging technologies have been developed to improve the density and functionality of semiconductor devices. These relatively new types of packaging technologies for semiconductor devices face manufacturing challenges.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIGS. 1A-1F are cross-sectional views of various stages of a process for forming a chip package structure, in accordance with some embodiments.

FIG. 1B-1 is a top view of the conductive line, the conductive vias thereunder, and the conductive plug thereunder of the chip package structure of FIG. 1B, in accordance with some embodiments.

FIG. 1B-2 is a top view of the conductive line and the conductive vias thereunder of the chip package structure of FIG. 1B, in accordance with some embodiments.

FIG. 1C-1 is a top view of the conductive lines and the conductive vias thereunder of the chip package structure of FIG. 1C, in accordance with some embodiments.

FIG. 1C-2 is a top view of the conductive lines and the conductive vias thereunder of the chip package structure of FIG. 1C, in accordance with some embodiments.

DETAILED DESCRIPTION

Figure 1A:
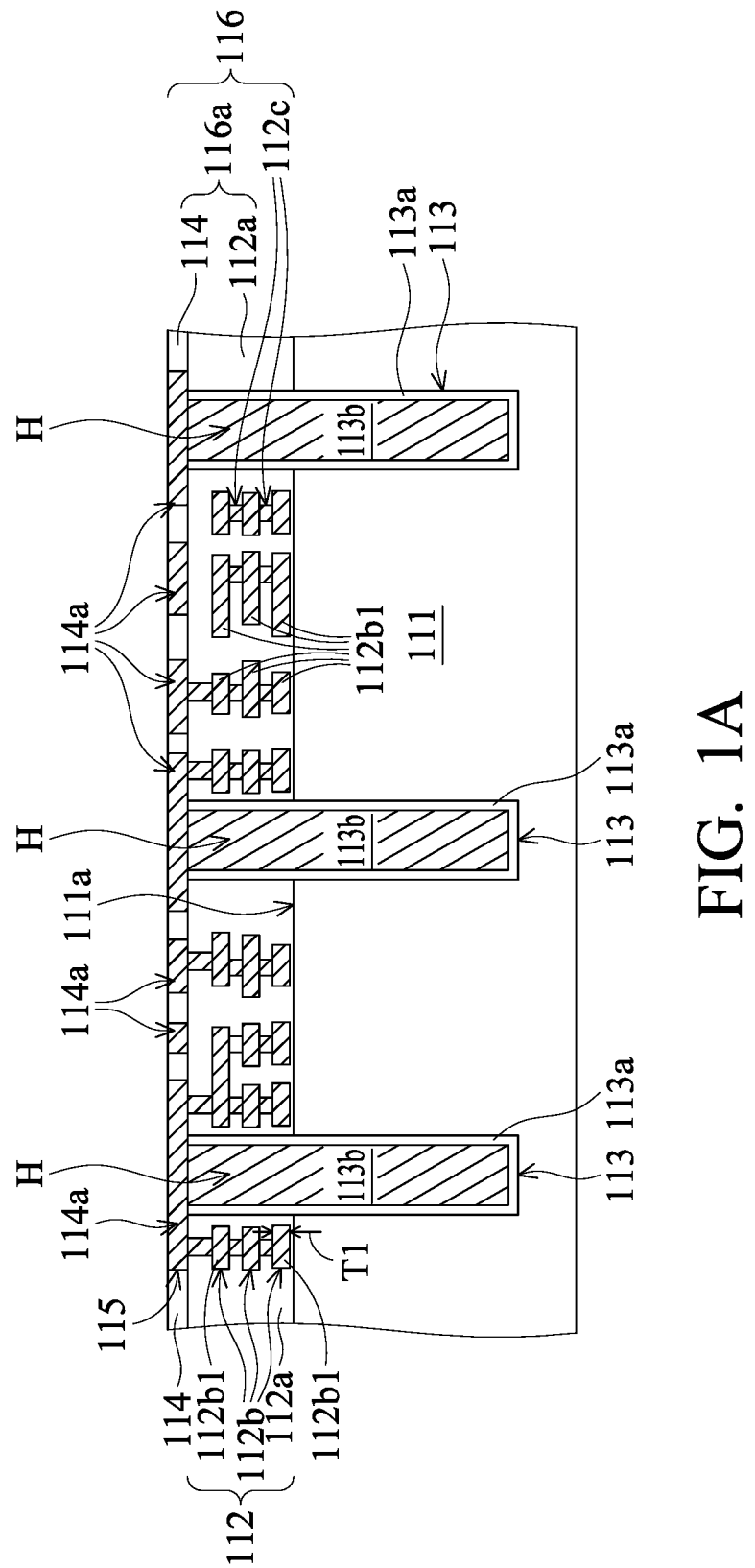

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. The term "substantially" may be varied in different technologies and be in the deviation range understood by the skilled in the art. For example, the term "substantially" may also relate to 90% of what is specified or higher, such as 95% of what is specified or higher, especially 99% of what is specified or higher, including 100% of what is specified, though the present invention is not limited thereto. Furthermore, terms such as "substantially parallel" or "substantially perpendicular" may be interpreted as not to exclude insignificant deviation from the specified arrangement and may include for example deviations of up to 10°. The word "substantially" does not exclude "completely" e.g. a composition which is "substantially free" from Y may be completely free from Y.

The term "about" may be varied in different technologies and be in the deviation range understood by the skilled in the art. The term "about" in conjunction with a specific distance or size is to be interpreted so as not to exclude insignificant deviation from the specified distance or size. For example, the term "about" may include deviations of up to 10% of what is specified, though the present invention is not limited thereto. The term "about" in relation to a numerical value x may mean x±5 or 10% of what is specified, though the present invention is not limited thereto.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The nanostructure transistor (e.g. nanosheet transistor, nanowire transistor, multi-bridge channel, nano-ribbon FET, gate all around (GAA) transistor structures) described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, smaller pitches than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure. Source/drain structure(s) may refer to a source or a drain, individually or collectively dependent upon the context.

FIGS. 1A-1F are cross-sectional views of various stages of a process for forming a chip package structure, in accordance with some embodiments. As shown in FIG. 1A, a semiconductor base 111 is provided, in accordance with some embodiments. The semiconductor base 111 includes, for example, a semiconductor substrate. The semiconductor base 111 includes, for example, a semiconductor wafer (such as a silicon wafer) or a portion of a semiconductor wafer.

In some embodiments, the semiconductor base 111 is made of an elementary semiconductor material including silicon or germanium in a single crystal structure, a polycrystal structure, or an amorphous structure. In some other embodiments, the semiconductor base 111 is made of a compound semiconductor, such as silicon carbide, gallium arsenide, gallium phosphide, indium phosphide, indium arsenide, an alloy semiconductor, such as SiGe or GaAsP, or a combination thereof. The semiconductor base 111 may also include multi-layer semiconductors, semiconductor on insulator (SOI) (such as silicon on insulator or germanium on insulator), or a combination thereof.

In some embodiments, the semiconductor base 111 is a device wafer that includes various device elements. In some embodiments, the various device elements are formed in and/or over the semiconductor base 111. The device elements are not shown in figures for the purpose of simplicity and clarity. Examples of the various device elements include active devices, passive devices, other suitable elements, or a combination thereof. The active devices may include transistors or diodes (not shown) formed at a surface of the semiconductor base 111. The passive devices include resistors, capacitors, or other suitable passive devices.

For example, the transistors may be metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc.

Various processes, such as front-end-of-line (FEOL) semiconductor fabrication processes, are performed to form the various device elements. The FEOL semiconductor fabrication processes may include deposition, etching, implantation, photolithography, annealing, planarization, one or more other applicable processes, or a combination thereof.

In some embodiments, isolation features (not shown) are formed in the semiconductor base 111. The isolation features are used to surround active regions and electrically isolate various device elements formed in and/or over the semiconductor base 111 in the active regions. In some embodiments, the isolation features include shallow trench isolation (STI) features, local oxidation of silicon (LOCOS) features, other suitable isolation features, or a combination thereof.

As shown in FIG. 1A, an interconnect layer 112 is formed over a front surface 111a of the semiconductor base 111, in accordance with some embodiments. The interconnect layer 112 includes a dielectric layer 112a, wiring layers 112b, and conductive vias 112c, in accordance with some embodiments. The dielectric layer 112a is formed over the front surface 111a, in accordance with some embodiments.

The wiring layers 112b are formed in the dielectric layer 112a, in accordance with some embodiments. Each wiring layer 112b includes conductive lines 112b1, in accordance with some embodiments. The bottommost conductive line 112b1 of the bottommost wiring layer 112b has a thickness T1 ranging from about 0.03 μm to about 0.08 μm, in accordance with some embodiments. The bottommost wiring layer 112b is the one closest to the semiconductor base 111, in accordance with some embodiments.

As shown in FIG. 1A, the conductive vias 112c are electrically connected between different wiring layers 112b and between the wiring layers 112b and the device elements (not shown) formed in and/or over the semiconductor base 111, in accordance with some embodiments.

The dielectric layer 112a is made of a dielectric material such as an oxide-containing material (e.g., silicon oxide), an oxynitride-containing material (e.g., silicon oxynitride), a low-k material, a porous dielectric material, glass, or a combination thereof, in accordance with some embodiments.

The glass includes borosilicate glass (BSG), phosphoric silicate glass (PSG), borophosphosilicate glass (BPSG), fluorinated silicate glass (FSG), or a combination thereof, in accordance with some embodiments. The dielectric layer 112a is formed by a deposition process (e.g., a chemical vapor deposition process), in accordance with some embodiments. The wiring layers 112*b* and the conductive vias 112*c* are made of a conductive material such as metal (e.g., aluminum, copper or tungsten) or alloy, in accordance with some embodiments.

As shown in FIG. 1A, portions of the semiconductor base 111 and the interconnect layer 112 are removed to form holes H, in accordance with some embodiments. The holes H pass through the interconnect layer 112 and extend into the semiconductor base 111, in accordance with some embodiments. The removal process is performed using an etching process such as a dry etching process, in accordance with some embodiments.

As shown in FIG. 1A, a dielectric layer 113*a* is conformally formed in the holes H, in accordance with some embodiments. The dielectric layer 113*a* includes a dielectric material such as an oxide-containing material (e.g., silicon oxide), an oxynitride-containing material (e.g., silicon oxynitride), a low-k material, a porous dielectric material, glass, or a combination thereof, in accordance with some embodiments.

The glass includes borosilicate glass (BSG), phosphoric silicate glass (PSG), borophosphosilicate glass (BPSG), fluorinated silicate glass (FSG), or a combination thereof, in accordance with some embodiments. The dielectric layer 113*a* is formed by a deposition process (e.g., a chemical vapor deposition process) and a planarization process (e.g., a chemical mechanical polishing process), in accordance with some embodiments.

As shown in FIG. 1A, a conductive layer 113*b* is formed over the dielectric layer 113*a* in the holes H, in accordance with some embodiments. The conductive layer 113*b* and the dielectric layer 113*a* together form conductive plugs 113, in accordance with some embodiments.

The conductive layer 113*b* is made of a conductive material, such as metal (e.g., copper, aluminum, gold, silver, or tungsten) or alloys thereof, in accordance with some embodiments. The conductive layer 113*b* is formed using a deposition process (e.g., a physical vapor deposition process) and a planarization process (e.g., a chemical mechanical polishing process), in accordance with some embodiments.

As shown in FIG. 1A, a dielectric layer 114 is formed over the interconnect layer 112, in accordance with some embodiments. The dielectric layer 114 is made of a dielectric material such as an oxide-containing material (e.g., silicon oxide), an oxynitride-containing material (e.g., silicon oxynitride), a low-k material, a porous dielectric material, glass, or a combination thereof, in accordance with some embodiments.

The glass includes borosilicate glass (BSG), phosphoric silicate glass (PSG), borophosphosilicate glass (BPSG), fluorinated silicate glass (FSG), or a combination thereof, in accordance with some embodiments. The dielectric layer 114 is formed by a deposition process (e.g., a chemical vapor deposition process), in accordance with some embodiments.

As shown in FIG. 1A, portions of the dielectric layer 114 are removed to form openings 114*a*, in accordance with some embodiments. The openings 114*a* pass through the dielectric layer 114 and expose the conductive vias 112*c* and the conductive plugs 113 thereunder, in accordance with some embodiments. The removal process is performed using an etching process such as a dry etching process, in accordance with some embodiments.

As shown in FIG. 1A, a wiring layer 115 is formed in the openings 114*a*, in accordance with some embodiments. The wiring layer 115 is connected to the conductive vias 112*c* and the conductive plugs 113 thereunder, in accordance with some embodiments. The interconnect layer 112, the dielectric layer 114, and the wiring layer 115 together form an interconnect structure 116, in accordance with some embodiments.

The wiring layer 115 is made of a conductive material, such as metal (e.g., copper, aluminum, gold, silver, or tungsten) or alloys thereof, in accordance with some embodiments. The wiring layer 115 is formed using a deposition process (e.g., a physical vapor deposition process) and a planarization process (e.g., a chemical mechanical polishing process), in accordance with some embodiments.

Figures 1, 1B:
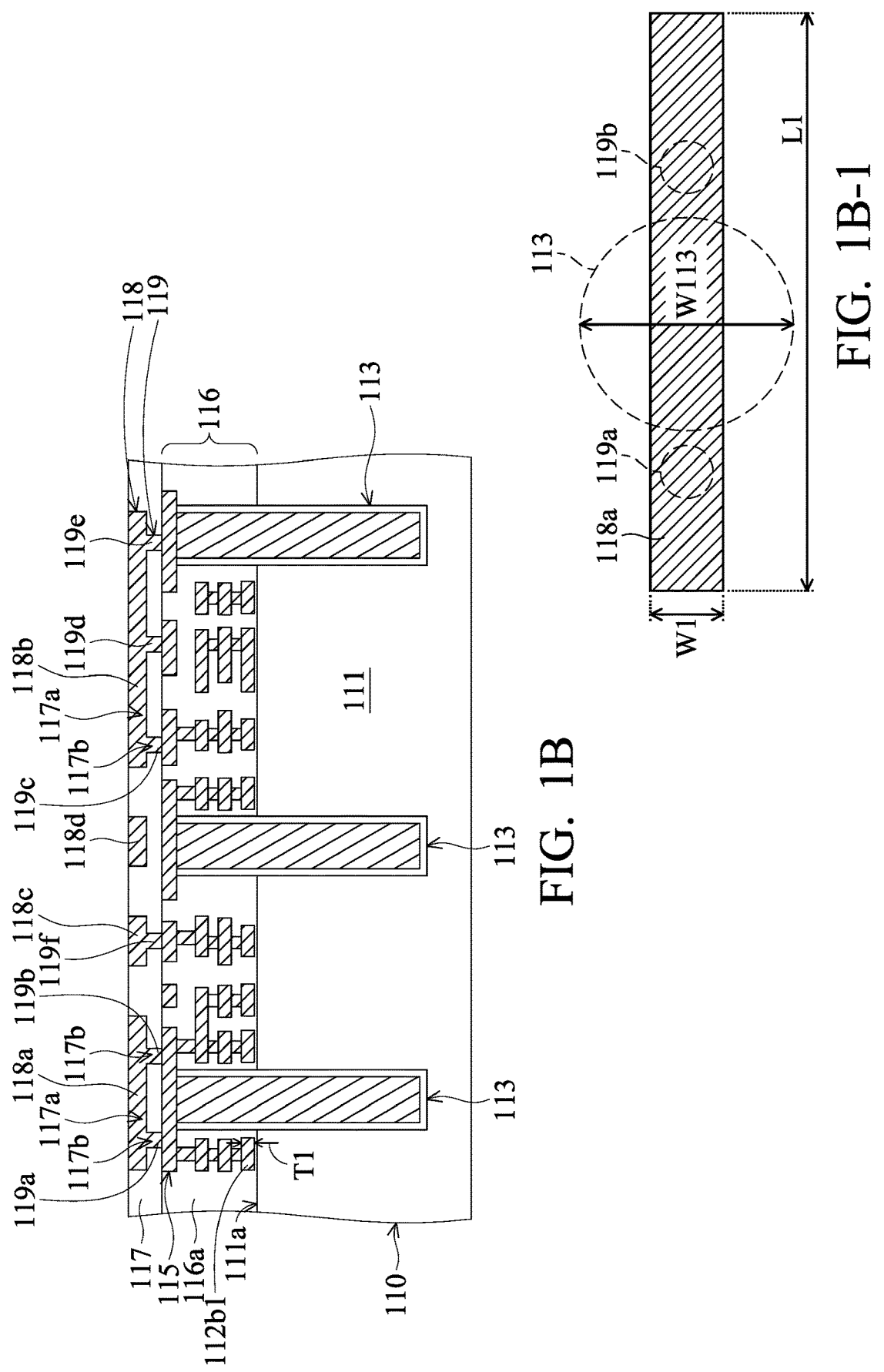

As shown in FIG. 1B, a dielectric layer 117 is formed over the interconnect structure 116, in accordance with some embodiments. The dielectric layer 117 is made of a dielectric material such as an oxide-containing material (e.g., silicon oxide), an oxynitride-containing material (e.g., silicon oxynitride), a low-k material, a porous dielectric material, glass, or a combination thereof, in accordance with some embodiments.

The glass includes borosilicate glass (BSG), phosphoric silicate glass (PSG), borophosphosilicate glass (BPSG), fluorinated silicate glass (FSG), or a combination thereof, in accordance with some embodiments. The dielectric layer 117 is formed by a deposition process (e.g., a chemical vapor deposition process), in accordance with some embodiments.

As shown in FIG. 1B, portions of the dielectric layer 117 are removed to form trenches 117*a* and via holes 117*b* under the trenches 117*a*, in accordance with some embodiments. The via holes 117*b* pass through the dielectric layer 117 and expose the wiring layer 115 thereunder, in accordance with some embodiments. The removal process includes a dual damascene process, in accordance with some embodiments. The removal process is performed using an etching process such as a dry etching process, in accordance with some embodiments.

As shown in FIG. 1B, conductive vias 119 are formed in the via holes 117*b*, and a wiring layer 118 is formed in the trenches 117*a*, in accordance with some embodiments. The semiconductor base 111, the interconnect structure 116, the dielectric layer 117, the wiring layer 118, and the conductive vias 119 together form a substrate 110, in accordance with some embodiments.

The wiring layer 118 includes conductive line 118*a*, 118*b*, 118*c*, and 118*d*, in accordance with some embodiments. The conductive line 118*a*, 118*b*, 118*c*, and 118*d* are used to be bonded to another substrate (not shown) in a subsequent process, in accordance with some embodiments. Therefore, the conductive line 118*a*, 118*b*, 118*c*, and 118*d* are also referred to as bonding lines, in accordance with some embodiments.

The conductive line 118*a* of the wiring layer 118 is connected to the wiring layer 115 through the conductive vias 119*a* and 119*b* (of the conductive vias 119), in accordance with some embodiments. The conductive vias 119*a* and 119*b* are in contact with the conductive line 118*a*, in accordance with some embodiments.

The conductive line 118*b* of the wiring layer 118 is connected to the wiring layer 115 through the conductive vias 119*c*, 119*d* and 119*e* (of the conductive vias 119), in accordance with some embodiments. The conductive vias 119*c*, 119*d* and 119*e* are in contact with conductive line 118*b*, in accordance with some embodiments.

The wiring layer 118 and the conductive vias 119 are made of a conductive material, such as metal (e.g., copper, aluminum, gold, silver, or tungsten) or alloys thereof, in accordance with some embodiments. The wiring layer 118 and the conductive vias 119 are formed using a deposition process (e.g., a physical vapor deposition process) and a planarization process (e.g., a chemical mechanical polishing process), in accordance with some embodiments.

FIG. 1B-1 is a top view of the conductive line 118a, the conductive vias 119a and 119b thereunder, and the conductive plug 113 thereunder of the chip package structure of FIG. 1B, in accordance with some embodiments. As shown in FIGS. 1B and 1B-1, a length L1 of the conductive line 118a is greater than a line width W1 of the conductive line 118a, in accordance with some embodiments.

The conductive line 118a extends across the conductive plug 113, in accordance with some embodiments. The length L1 is greater than a width W113 of the conductive plug 113, in accordance with some embodiments. The line width W1 of the conductive line 118a is less than the width W113 of the conductive plug 113, in accordance with some embodiments.

Figures 1, 1B, 2:
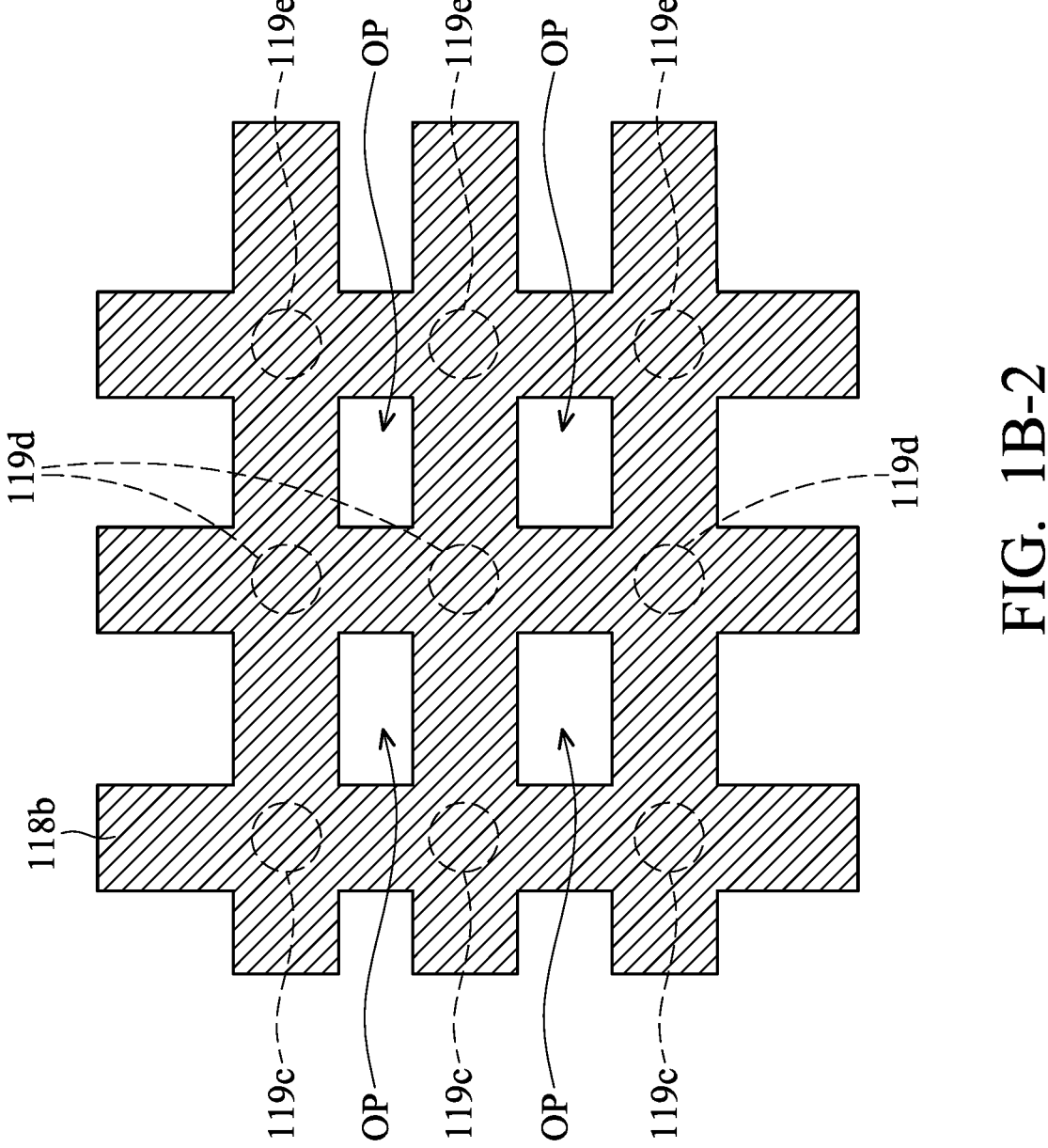

FIG. 1B-2 is a top view of the conductive line 118b and the conductive vias 119c, 119d, and 119e thereunder of the chip package structure of FIG. 1B, in accordance with some embodiments. As shown in FIGS. 1B and 1B-2, the conductive line 118b has a mesh-like shape, in accordance with some embodiments. The conductive line 118b has openings OP, in accordance with some embodiments. In some other embodiments (not shown), the conductive line 118a, 118c, or 118d has a mesh-like shape, in accordance with some embodiments.

Figure 1C:
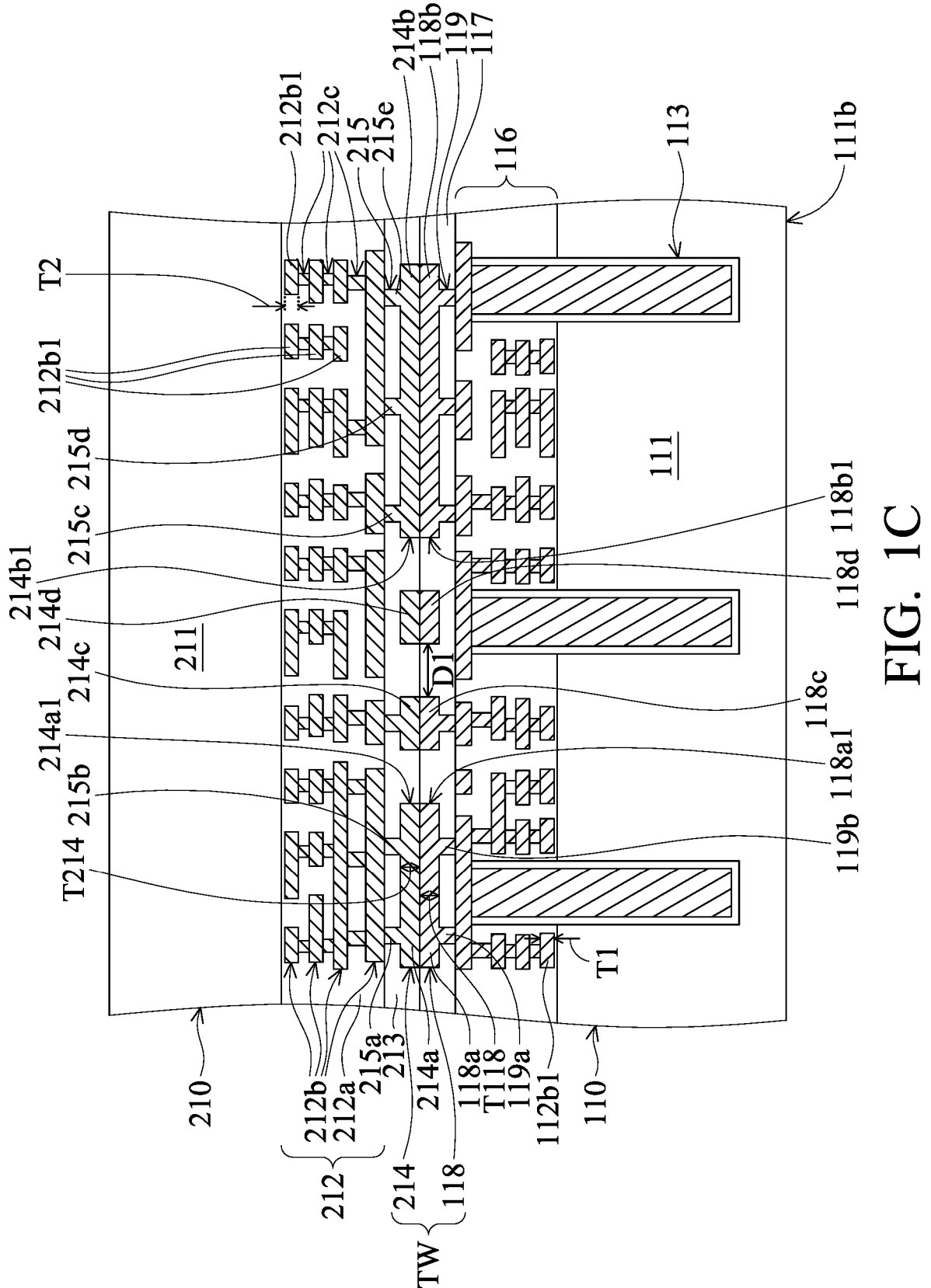
Figures 1, 1C:
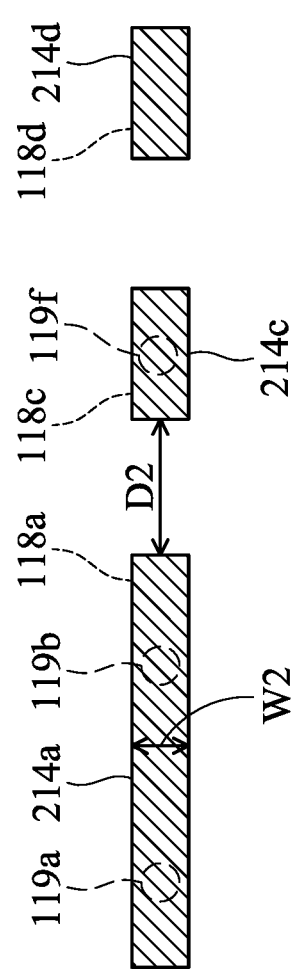
Figures 1, 1C, 2:
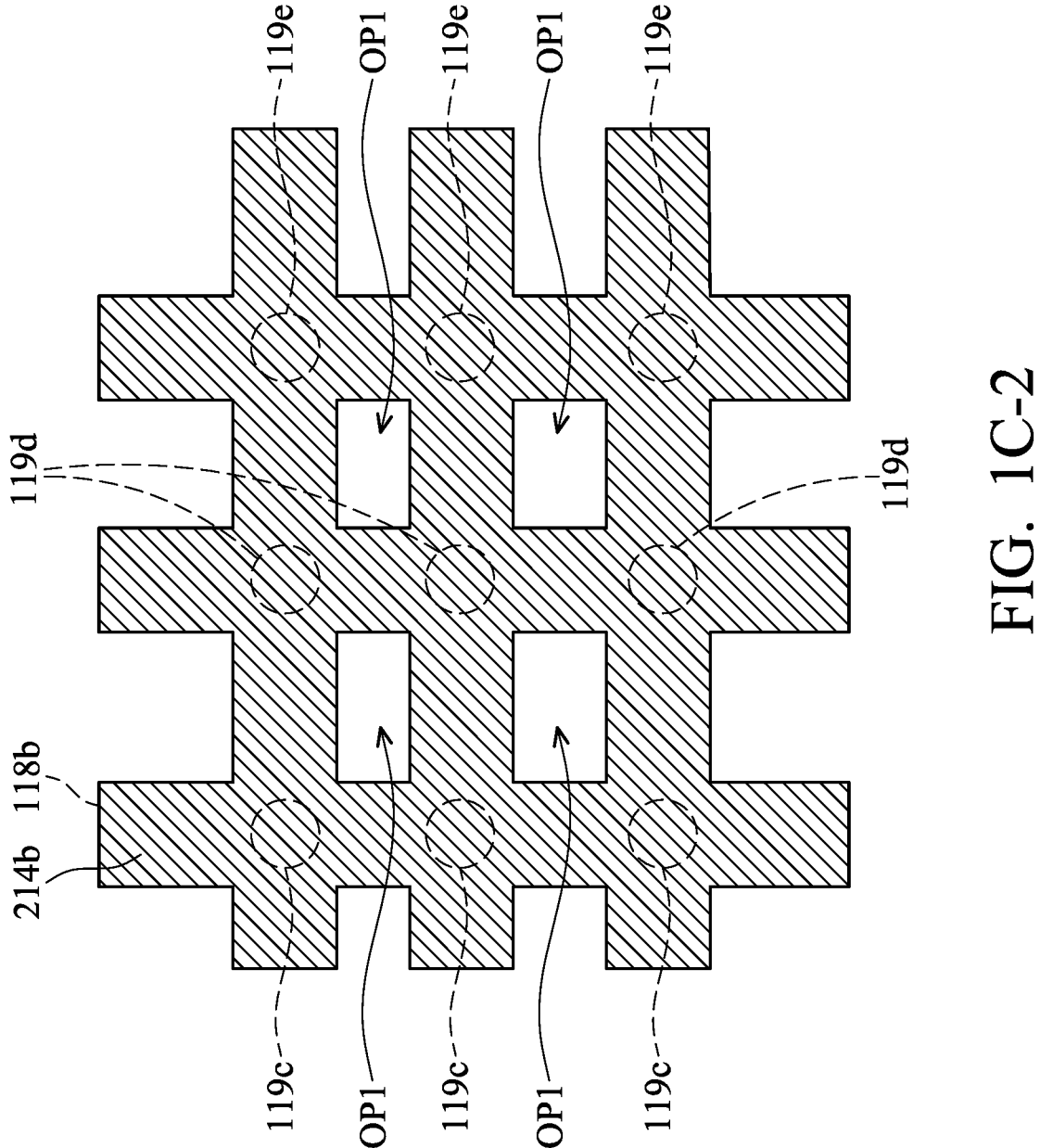

As shown in FIG. 1C, a substrate 210 is provided, in accordance with some embodiments. The substrate 210 is similar to the substrate 110, in accordance with some embodiments. The substrate 210 includes a semiconductor base 211, an interconnect structure 212, a dielectric layer 213, a wiring layer 214, and conductive vias 215, in accordance with some embodiments.

The semiconductor base 211 includes, for example, a semiconductor substrate. The semiconductor base 211 includes, for example, a semiconductor wafer (such as a silicon wafer) or a portion of a semiconductor wafer. In some embodiments, the semiconductor base 211 is made of an elementary semiconductor material including silicon or germanium in a single crystal structure, a polycrystal structure, or an amorphous structure.

In some other embodiments, the semiconductor base 211 is made of a compound semiconductor, such as silicon carbide, gallium arsenide, gallium phosphide, indium phosphide, indium arsenide, an alloy semiconductor, such as SiGe or GaAsP, or a combination thereof. The semiconductor base 211 may also include multi-layer semiconductors, semiconductor on insulator (SOI) (such as silicon on insulator or germanium on insulator), or a combination thereof.

In some embodiments, the semiconductor base 211 is a device wafer that includes various device elements. In some embodiments, the various device elements are formed in and/or over the semiconductor base 211. The device elements are not shown in figures for the purpose of simplicity and clarity. Examples of the various device elements include active devices, passive devices, other suitable elements, or a combination thereof. The active devices may include transistors or diodes (not shown) formed at a surface of the semiconductor base 211. The passive devices include resistors, capacitors, or other suitable passive devices.

For example, the transistors may be metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc.

Various processes, such as front-end-of-line (FEOL) semiconductor fabrication processes, are performed to form the various device elements. The FEOL semiconductor fabrication processes may include deposition, etching, implantation, photolithography, annealing, planarization, one or more other applicable processes, or a combination thereof.

In some embodiments, isolation features (not shown) are formed in the semiconductor base 211. The isolation features are used to surround active regions and electrically isolate various device elements formed in and/or over the semiconductor base 211 in the active regions. In some embodiments, the isolation features include shallow trench isolation (STI) features, local oxidation of silicon (LOCOS) features, other suitable isolation features, or a combination thereof.

The interconnect structure 212 is over the semiconductor base 211, in accordance with some embodiments. The interconnect structure 212 includes a dielectric layer 212a, wiring layers 212b, and conductive vias 212c, in accordance with some embodiments. The wiring layers 212b are formed in the dielectric layer 212a, in accordance with some embodiments.

Each wiring layer 212b includes conductive lines 212b1, in accordance with some embodiments. The conductive line 212b1 of the wiring layer 212b, which is closest to the semiconductor base 211, has a thickness T2 ranging from about 0.02 nm to about 0.08 nm, in accordance with some embodiments.

The conductive vias 212c are electrically connected between different wiring layers 212b and between the wiring layers 212b and the device elements (not shown) formed in and/or over the semiconductor base 111, in accordance with some embodiments.

The dielectric layer 212a is made of a dielectric material such as an oxide-containing material (e.g., silicon oxide), an oxynitride-containing material (e.g., silicon oxynitride), a low-k material, a porous dielectric material, glass, or a combination thereof, in accordance with some embodiments.

The glass includes borosilicate glass (BSG), phosphoric silicate glass (PSG), borophosphosilicate glass (BPSG), fluorinated silicate glass (FSG), or a combination thereof, in accordance with some embodiments. The dielectric layer 212a is formed by a deposition process (e.g., a chemical vapor deposition process), in accordance with some embodiments. The wiring layers 212b and the conductive vias 212c are made of a conductive material such as metal (e.g., aluminum, copper or tungsten) or alloy, in accordance with some embodiments.

As shown in FIG. 1C, a dielectric layer 213 is formed over the interconnect structure 212, in accordance with some embodiments. The dielectric layer 213 is made of a dielectric material such as an oxide-containing material (e.g., silicon oxide), an oxynitride-containing material (e.g., silicon oxynitride), a low-k material, a porous dielectric material, glass, or a combination thereof, in accordance with some embodiments.

The glass includes borosilicate glass (BSG), phosphoric silicate glass (PSG), borophosphosilicate glass (BPSG), fluorinated silicate glass (FSG), or a combination thereof, in accordance with some embodiments. The dielectric layer 213 is formed by a deposition process (e.g., a chemical vapor deposition process), in accordance with some embodiments.

As shown in FIG. 1C, a wiring layer 214 and conductive vias 215 are formed in the dielectric layer 213, in accordance with some embodiments. The wiring layer 214 includes conductive line 214a, 214b, 214c, and 214d, in accordance with some embodiments. The conductive line 214a, 214b, 214c, and 214d are used to be bonded to the substrate 110, in accordance with some embodiments. Therefore, the conductive line 214a, 214b, 214c, and 214d are also referred to as bonding lines, in accordance with some embodiments.

The conductive line 214a of the wiring layer 214 is connected to the wiring layer 212b through the conductive vias 215a and 215b (of the conductive vias 215), in accordance with some embodiments. The conductive vias 215a and 215b are in contact with the conductive line 214a, in accordance with some embodiments.

The conductive line 214b of the wiring layer 214 is connected to the wiring layer 212b through the conductive vias 215c, 215d and 215e (of the conductive vias 215), in accordance with some embodiments. The conductive vias 215c, 215d and 215e are in contact with conductive line 214b, in accordance with some embodiments.

The wiring layer 214 and the conductive vias 215 are made of a conductive material, such as metal (e.g., copper, aluminum, gold, silver, or tungsten) or alloys thereof, in accordance with some embodiments. The wiring layer 214 and the conductive vias 215 are formed using a deposition process (e.g., a physical vapor deposition process) and a planarization process (e.g., a chemical mechanical polishing process), in accordance with some embodiments.

As shown in FIG. 1C, the substrate 210 is bonded to the substrate 110, in accordance with some embodiments. The wiring layer 118 is bonded to the wiring layer 214, in accordance with some embodiments. Specifically, the conductive lines 214a, 214b, 214c, and 214d are bonded to the conductive lines 118a, 118b, 118c, and 118d respectively, in accordance with some embodiments.

The conductive lines 214a, 214b, 214c, and 214d are in contact with the conductive lines 118a, 118b, 118c, and 118d respectively, in accordance with some embodiments. In some embodiments, a sidewall 118a1 of the conductive line 118a is substantially coplanar with a sidewall 214a1 of the conductive line 214a.

In some embodiments, a sidewall 118b1 of the conductive line 118b is substantially coplanar with a sidewall 214b1 of the conductive line 214b. In some embodiments, sidewalls of the conductive lines 214c and 214d are substantially and respectively coplanar with sidewalls of the conductive lines 118c and 118d.

FIG. 1C-1 is a top view of the conductive lines 118a, 118c, 118d, 214a, 214c, and 214d and the conductive vias 119a, 119b, and 119f thereunder of the chip package structure of FIG. 1C, in accordance with some embodiments. As shown in FIGS. 1C and 1C-1, the layout of the conductive lines 118a, 118c, and 118d is the same as the layout of the conductive lines 214a, 214c, and 214d, in accordance with some embodiments.

The wiring layers 118 and 214 are completely overlapped with each other, in accordance with some embodiments. Specifically, the conductive lines 118a and 214a are completely overlapped with each other, in accordance with some embodiments. That is, the conductive lines 118a and 214a have the same shape, the same width, and the same length, in accordance with some embodiments.

The conductive lines 118b and 214b are completely overlapped with each other, in accordance with some embodiments. The conductive lines 118c and 214c are completely overlapped with each other, in accordance with some embodiments. The conductive lines 118d and 214d are completely overlapped with each other, in accordance with some embodiments.

FIG. 1C-2 is a top view of the conductive lines 118b and 214b and the conductive vias 119c, 119d, and 119e thereunder of the chip package structure of FIG. 1C, in accordance with some embodiments. As shown in FIGS. 1C and 1C-2, the conductive line 214b has a mesh-like shape, in accordance with some embodiments.

The conductive line 214b has openings OP1, in accordance with some embodiments. The conductive lines 118b and 214b are completely overlapped with each other, in accordance with some embodiments.

In some other embodiments (not shown), the conductive lines 214a, 214c, and 214d has a mesh-like shape, and the conductive lines 214a, 214c, and 214d are completely overlapped with the conductive lines 118a, 118c, and 118d respectively, in accordance with some embodiments.

Since the substrate 210 is bonded to the substrate 110 through the wiring layers 118 and 214 instead of bonding pads, the layout design of the wiring layers of the substrates 110 and 210 are not limited to the arrangement of bonding pads, which improves the flexibility of the layout design, in accordance with some embodiments.

The wiring layers 118 and 214 together form a thick wiring layer TW, in accordance with some embodiments. Since the thickness of the thick wiring layer TW is larger than that of the wiring layer 118 or 214, the horizontal resistance of the thick wiring layer TW is reduced, which improves the power distributed network parasitic effect such as IR drop, the signal transmission speed, and the performance of the chip package structure of FIG. 1C, in accordance with some embodiments.

The wiring layer 118 has a thickness T118 ranging from about 0.1 μm to 0.2 μm, in accordance with some embodiments. The ratio of the thickness T118 to the thickness T1 of the bottommost conductive line 112b1 of the bottommost wiring layer 112b ranges from about 1.2 to about 7, in accordance with some embodiments. If the ratio of the thickness T118 to the thickness T1 is less than 1.2, the wiring layer 118 may be too thin and the resistance of the wiring layer 118 may be too large.

Due to the limitation of process capability, the ratio of the line width to the line thickness needs to be maintained within a fixed range, in accordance with some embodiments. If the ratio of the thickness T118 to the thickness T1 is greater than 7, the wiring layer 118 may be too thick and the line width of the wiring layer 118 is increased, which increases the distance between the conductive line 118a, 118b, 118c, and 118d of the wiring layer 118.

If the distance between the conductive line 118a, 118b, 118c, and 118d of the wiring layer 118 is increased, the line density of the wiring layer 118 is decreased, which adversely affects the signal transmission between the substrates 110 and 210. That is, if the line thickness is large, the line density is low.

As shown in FIGS. 1B-1 and 1C, since the wiring layer 118 is thin, the line width W1 of the wiring layer 118 is small, and the average distance D1 between the conductive line 118a, 118b, 118c, and 118d of the wiring layer 118 is reduced, in accordance with some embodiments. The conductive line 118c is used as a signal line to transmit signals, in accordance with some embodiments.

The wiring layer 214 has a thickness T214 ranging from about 0.1 μm to 0.2 μm, in accordance with some embodiments. The ratio of the thickness T214 to the thickness T2 of the bottommost conductive line 212b1 of the bottommost wiring layer 212b ranges from about 1.2 to about 7, in accordance with some embodiments. If the ratio of the thickness T214 to the thickness T2 is less than 1.2, the wiring layer 214 may be too thin and the resistance of the wiring layer 214 may be too large.

Due to the limitation of process capability, the ratio of the line width to the line thickness needs to be maintained within a fixed range, in accordance with some embodiments. If the ratio of the thickness T214 to the thickness T2 is greater than 7, the wiring layer 214 may be too thick and the line width of the wiring layer 214 is increased, which increases the distance between the conductive line 214a, 214b, 214c, and 214d of the wiring layer 214, adversely affecting the signal transmission between the substrates 110 and 210.

As shown in FIGS. 1C and 1C-1, since the wiring layer 214 is thin, the line width W2 of the wiring layer 214 is small, and the average distance D2 between the conductive line 214a, 214b, 214c, and 214d of the wiring layer 214 is reduced, in accordance with some embodiments. The conductive line 214c is used as a signal line to transmit signals, in accordance with some embodiments.

Figure 1D:
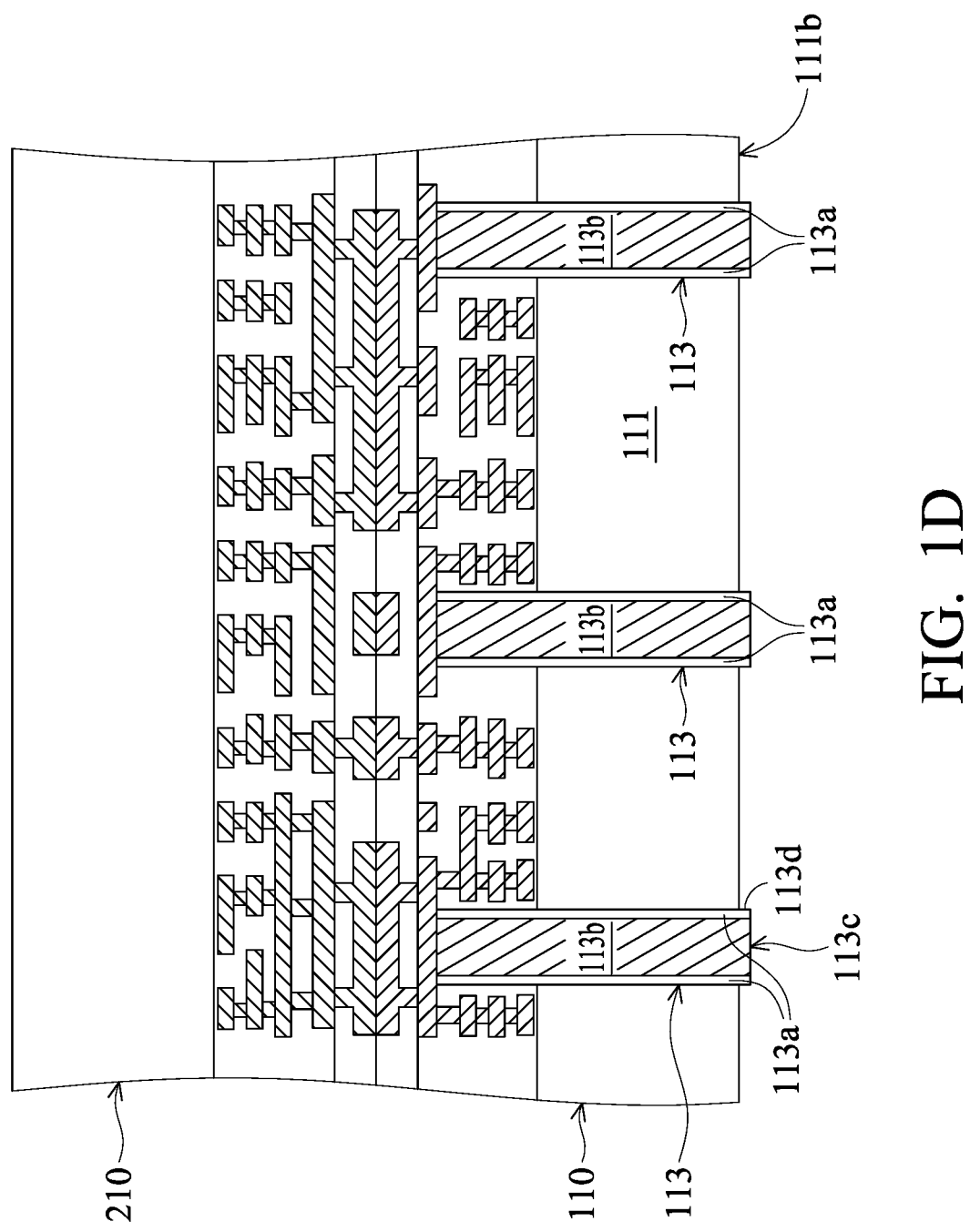

As shown in FIGS. 1C and 1D, bottom portions of the semiconductor base 111 and the conductive plugs 113 are removed, in accordance with some embodiments. The bottom portions of the dielectric layer 113a and the conductive layer 113b are removed, in accordance with some embodiments. The removal process includes a thinning process such as a planarization process (e.g., a chemical mechanical polishing process), in accordance with some embodiments.

During the removal process, the removal speed of the semiconductor base 111 may be greater than that of the conductive plugs 113. Therefore, bottom portions 113d of the conductive plugs 113 protrude from the bottom surface 111b of the semiconductor base 111 after the removal process, in accordance with some embodiments. As a result, the bottom surface 113c of the conductive plug 113 is lower than the bottom surface 111b of the semiconductor base 111, in accordance with some embodiments.

Figure 1E:
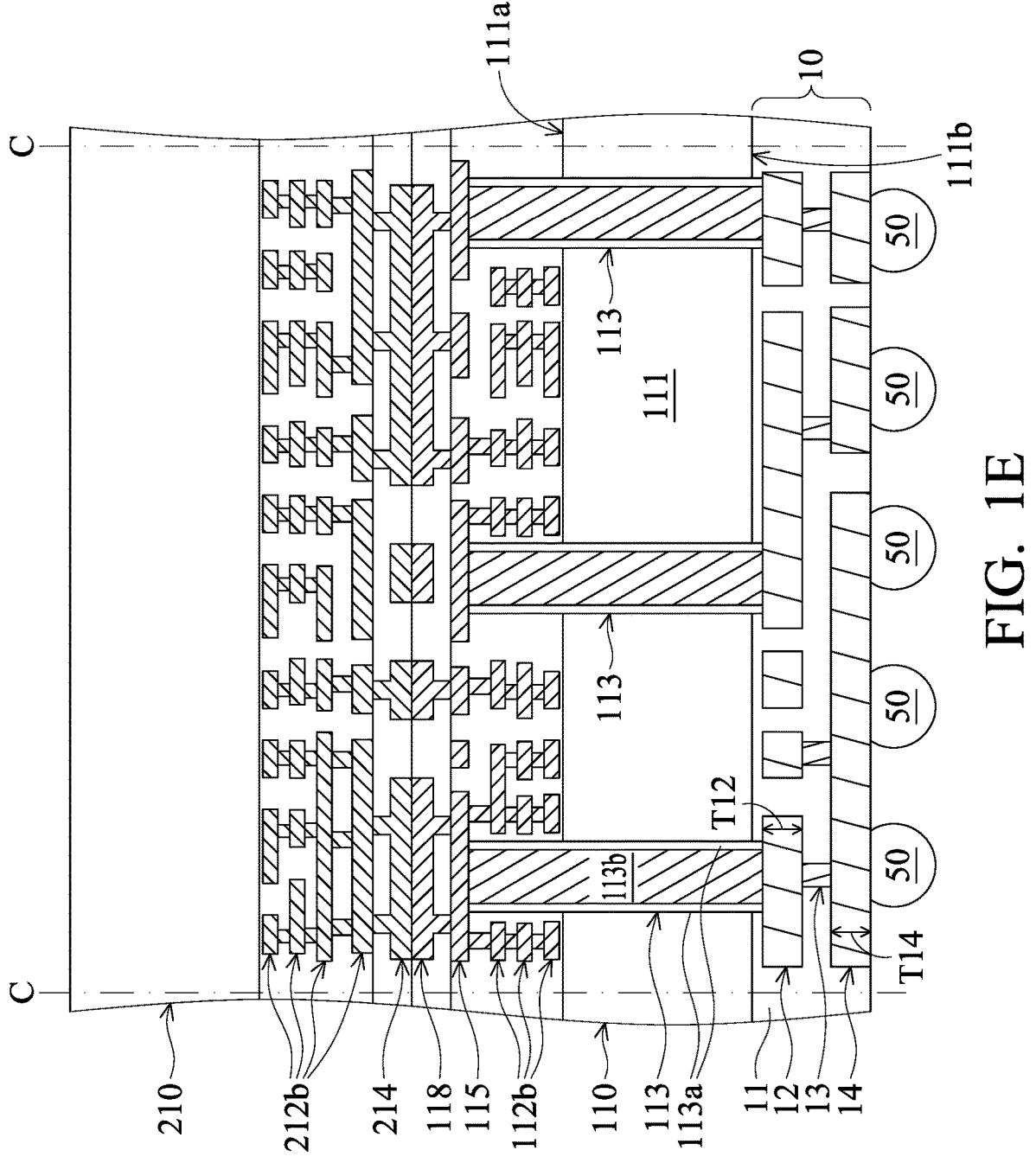

As shown in FIG. 1E, a redistribution layer 10 is formed over the bottom surface 111b of the semiconductor base 111, in accordance with some embodiments. The redistribution layer 10 is used to increase the design flexibility of the position and quantity of the conductive plug 113 and conductive bumps formed in the subsequent process, in accordance with some embodiments. The redistribution layer 10 includes a dielectric layer 11, a wiring layer 12, conductive vias 13, and the conductive bonding layer 14, in accordance with some embodiments.

The wiring layer 12, the conductive vias 13, and the conductive bonding layer 14 are formed in the dielectric layer 11, in accordance with some embodiments. The wiring layer 12 is formed over the bottom surface 111b of the semiconductor base 111 and the conductive plug 113, in accordance with some embodiments. The conductive vias 13 are connected between the wiring layer 12 and the conductive bonding layer 14, in accordance with some embodiments.

The wiring layer 12 is used for power transmission or grounding, so the wiring layer 12 needs to have a larger thickness to withstand large currents, in accordance with some embodiments. The wiring layer 12 has a thickness T12 ranging from about 0.5 μm to 2 μm, in accordance with some embodiments. The wiring layer 12 is thicker than each of wiring layers 112b, 115, 118, 212b, 214, and 118, in accordance with some embodiments. The line density of the wiring layer 12 is less than each of wiring layers 112b, 115, 118, 212b, and 214, in accordance with some embodiments.

The conductive bonding layer 14 is used for power transmission or grounding, so the conductive bonding layer 14 needs to have a larger thickness to withstand large currents, in accordance with some embodiments. The conductive bonding layer 14 has a thickness T14 ranging from about 0.5 μm to 2 μm, in accordance with some embodiments. The conductive bonding layer 14 is thicker than each of wiring layers 112b, 115, 118, 212b, and 214, in accordance with some embodiments. The density of the conductive bonding layer 14 is less than each of wiring layers 112b, 115, 118, 212b, and 214, in accordance with some embodiments.

The (thick and low-density) wiring layer 12 and the (thick and low-density) conductive bonding layer 14 are formed over the bottom surface 111b of the semiconductor base 111 rather than over the front surface 111a of the semiconductor base 111, which prevents the (thick and low-density) wiring layer 12 and the (thick and low-density) conductive bonding layer 14 from occupying the space above the front surface 111a, in accordance with some embodiments. Therefore, the space above the front surface 111a can accommodate more (thin and high-density) wiring layers, in accordance with some embodiments.

The dielectric layer 11 is made of a dielectric material such as an oxide-containing material (e.g., silicon oxide), an oxynitride-containing material (e.g., silicon oxynitride), a low-k material, a porous dielectric material, glass, or a combination thereof, in accordance with some embodiments.

The glass includes borosilicate glass (BSG), phosphoric silicate glass (PSG), borophosphosilicate glass (BPSG), fluorinated silicate glass (FSG), or a combination thereof, in accordance with some embodiments. The dielectric layer 11 is formed by a deposition process (e.g., a chemical vapor deposition process), in accordance with some embodiments. The wiring layer 12, the conductive vias 13 and the conductive bonding layer 14 are made of a conductive material such as metal (e.g., aluminum, copper or tungsten) or alloy, in accordance with some embodiments.

As shown in FIG. 1E, conductive bumps 50 are formed over the conductive bonding layer 14, in accordance with some embodiments. The conductive bumps 50 is made of a conductive material, such as a tin-based alloy, in accordance with some embodiments.

Figure 1F:
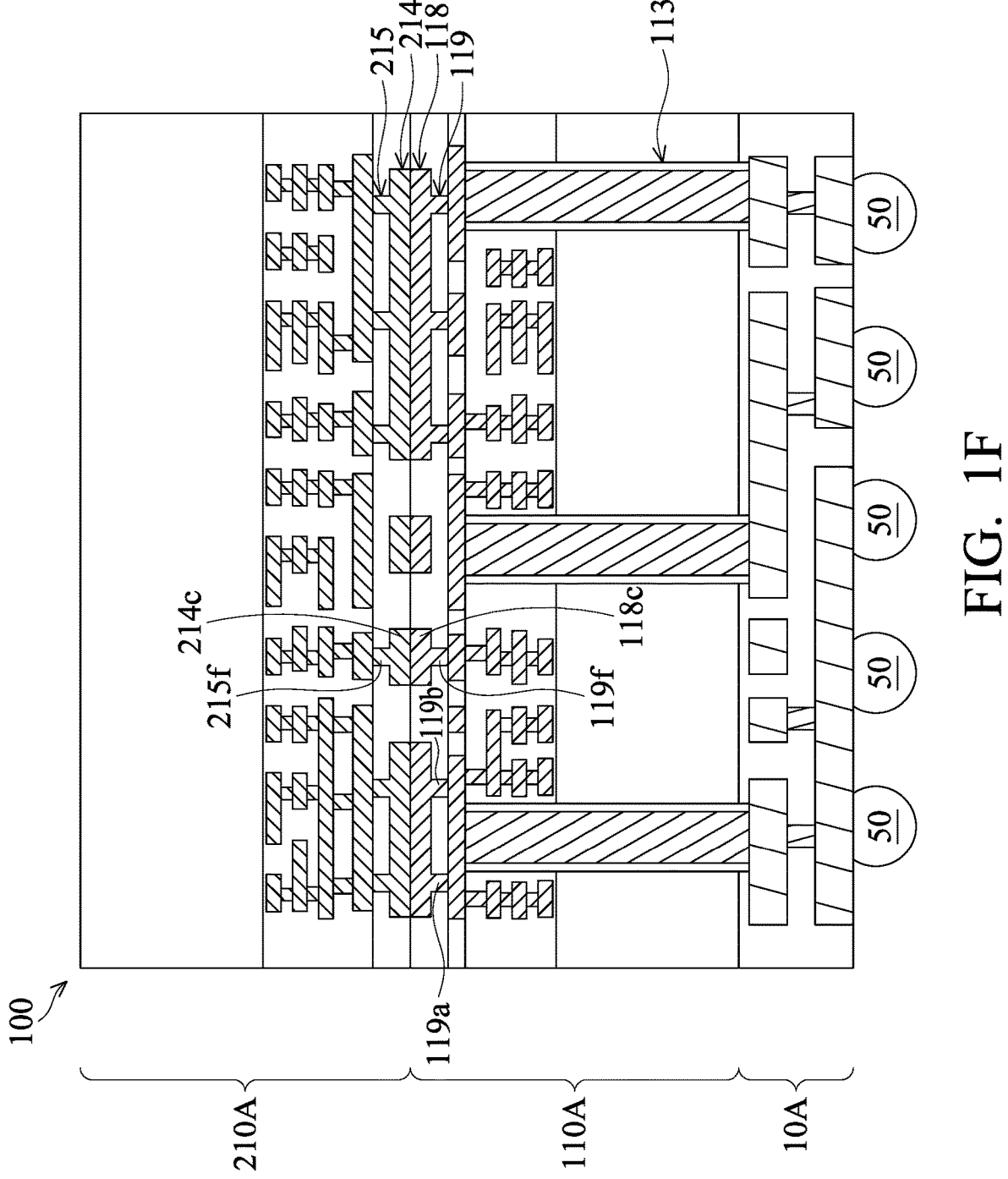

As shown in FIGS. 1E and 1F, a cutting process is performed along the cutting lines C of FIG. 1E to cut the substrates 110 and 210 and the redistribution layer 10 to form chip package structures 100, in accordance with some embodiments. For the sake of simplicity, FIG. 1F only shows one of the chip package structures 100, in accordance with some embodiments.

The chip package structure 100 includes a redistribution layer 10A, a substrate 110A, a substrate 210A, and the conductive bumps 50, in accordance with some embodiments. The redistribution layer 10A is a portion of the redistribution layer 10, in accordance with some embodiments. The substrate 110A is a portion of the substrate 110, in accordance with some embodiments. The substrate 210A is a portion of the substrate 210, in accordance with some embodiments.

Figures 2A, 2B, 2C:
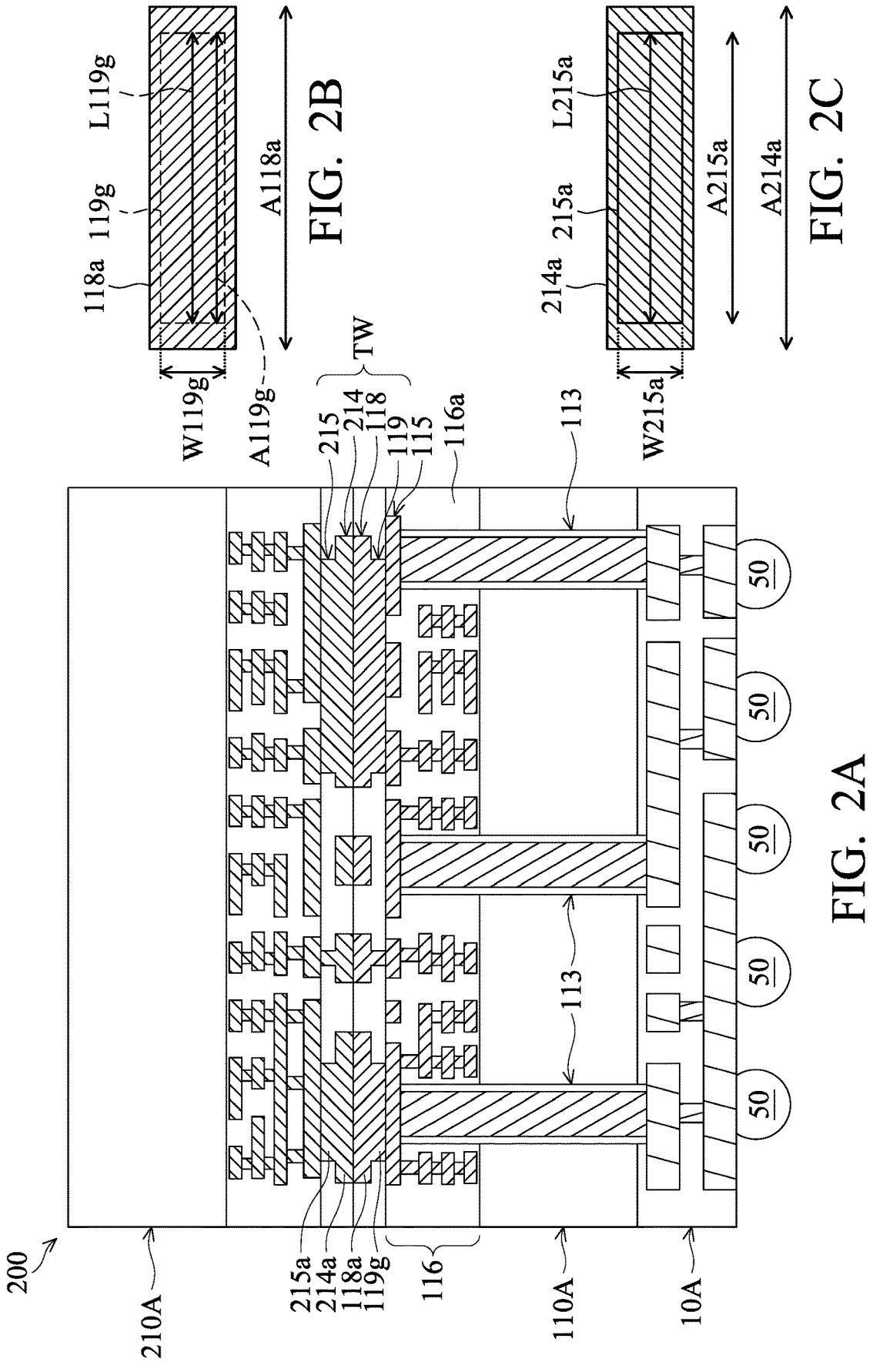
FIG. 2A is a cross-sectional view of a chip package structure, in accordance with some embodiments.
FIG. 2B is a top view of the conductive line and the conductive via thereover of the chip package structure of FIG. 2A, in accordance with some embodiments.
FIG. 2C is a top view of the conductive line and the conductive via thereunder of the chip package structure of FIG. 2A, in accordance with some embodiments.

FIG. 2A is a cross-sectional view of a chip package structure 200, in accordance with some embodiments. As shown in FIG. 2A, the chip package structure 200 is similar to the chip package structure 100 of FIG. 1F, except that the conductive via 119 of the substrate 110A of the chip package structure 200 is wider than that of the chip package structure 100 of FIG. 1F, and the conductive via 215 of the substrate 210A of the chip package structure 200 is wider than that of the chip package structure 100 of FIG. 1F, in accordance with some embodiments.

For example, the conductive via 119g under the conductive line 118a of the chip package structure 200 is wider than the conductive via 119a or 119b of the chip package structure 100, in accordance with some embodiments.

FIG. 2B is a top view of the conductive line 118a and the conductive via 119g thereover of the chip package structure 200 of FIG. 2A, in accordance with some embodiments. As shown in FIGS. 2A and 2B, a length L119g of the conductive via 119g is greater than a line width W119g of the conductive via 119g, in accordance with some embodiments. In some embodiments, a longitudinal axis A119g of the conductive via 119g is substantially parallel to a longitudinal axis A118a of the conductive line 118a, in accordance with some embodiments.

FIG. 2C is a top view of the conductive line 214a and the conductive via 215a thereover of the chip package structure 200 of FIG. 2A, in accordance with some embodiments. As shown in FIGS. 2A, 2B and 2C, a length L215a of the conductive via 215a (of the conductive via 215) is greater than a line width W215a of the conductive via 215a, in accordance with some embodiments. In some embodiments, a longitudinal axis A215a of the conductive via 215a is substantially parallel to a longitudinal axis A214a of the conductive line 214a, in accordance with some embodiments.

Since the conductive vias 119 and 215 are widened, the conductive vias 119 and 215 and the wiring layers 118 and 214 together form the thick wiring layer TW, in accordance with some embodiments. Since the thickness of the thick wiring layer TW is increased, the horizontal resistance of the thick wiring layer TW is reduced, which improves the signal transmission speed and the performance of the chip package structure 200, in accordance with some embodiments.

Figure 3:
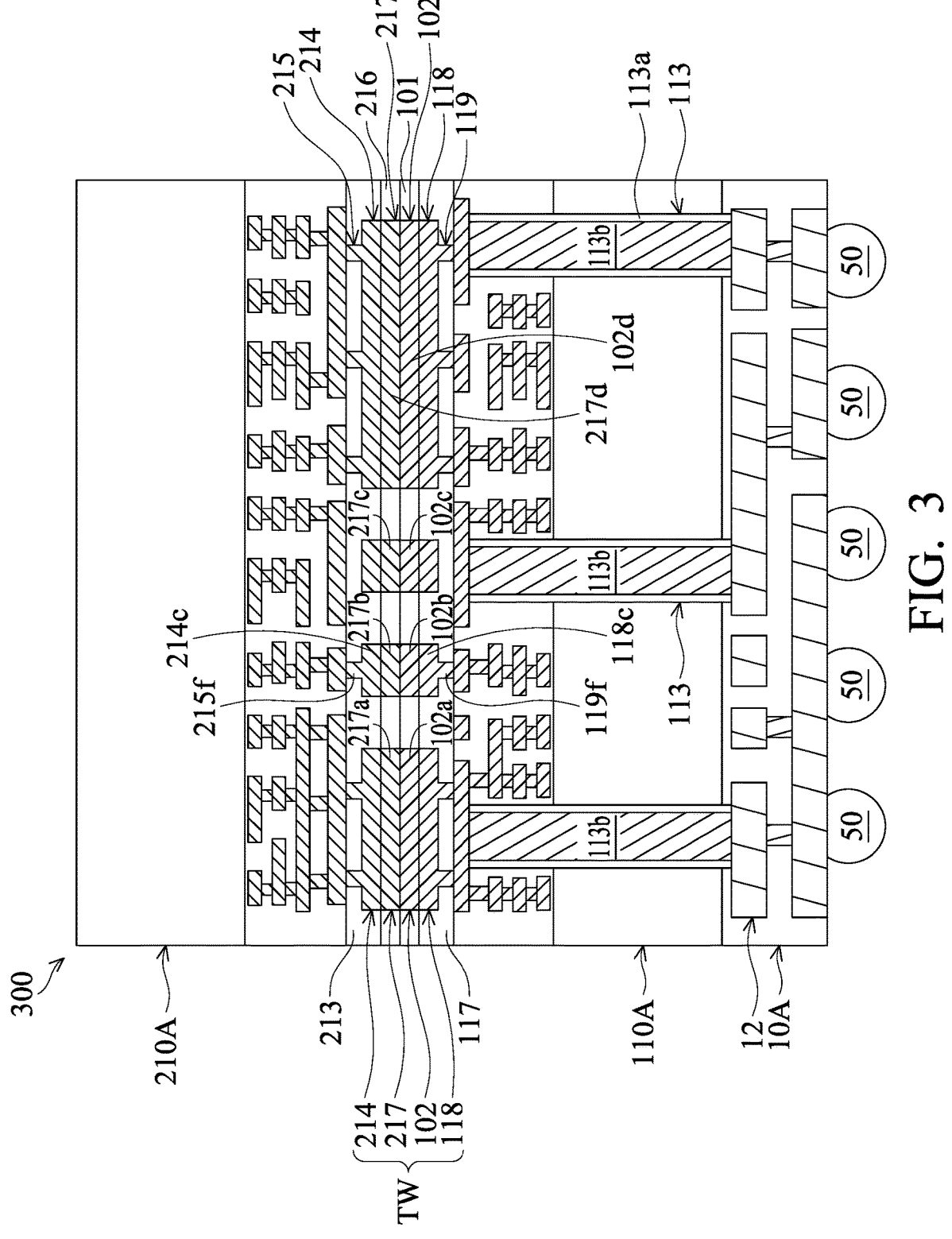
FIG. 3 is a cross-sectional view of a chip package structure, in accordance with some embodiments.

FIG. 3 is a cross-sectional view of a chip package structure 300, in accordance with some embodiments. As shown in FIG. 3, the chip package structure 300 is similar to the chip package structure 100 of FIG. 1F, except that the chip package structure 300 further includes dielectric layers 101 and 216 and wiring layers 102 and 217, in accordance with some embodiments. The The dielectric layer 101 is formed over the dielectric layer 117, in accordance with some embodiments. The wiring layer 102 is formed in the dielectric layer 101 and on the wiring layer 118, in accordance with some embodiments. The dielectric layer 216 is formed over the dielectric layer 213, in accordance with some embodiments. The wiring layer 217 is formed in the dielectric layer 216 and on the wiring layer 214, in accordance with some embodiments.

The wiring layer 102 includes conductive lines 102a, 102b, 102c, and 102d, in accordance with some embodiments. The wiring layer 217 includes conductive lines 217a, 217b, 217c, and 217, in accordance with some embodiments. The conductive lines 102a, 102b, 102c, 102d, 217a, 217b, 217c, and 217 are also referred to as bonding lines, in accordance with some embodiments.

The wiring layers 102, 118, 214 and 217 are completely overlapped with each other, in accordance with some embodiments. Therefore, the wiring layers 102, 118, 214 and 217 together form the thick wiring layer TW, in accordance with some embodiments. Since the thickness of the thick wiring layer TW is increased, the horizontal resistance of the thick wiring layer TW is reduced, which improves the signal transmission speed and the performance of the chip package structure 300, in accordance with some embodiments.

Figures 4A, 4B:
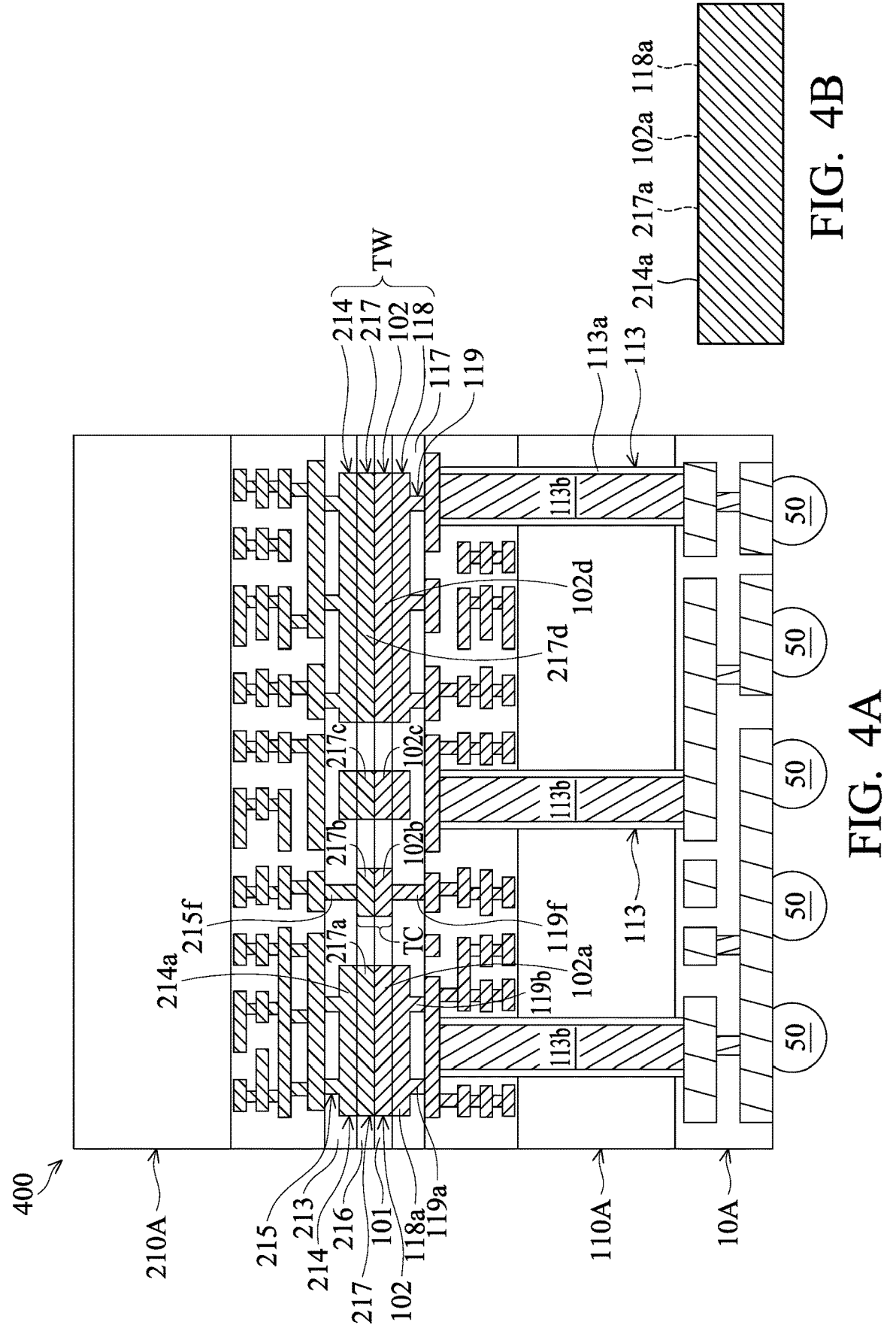
FIG. 4A is a cross-sectional view of a chip package structure, in accordance with some embodiments.
FIG. 4B is a top view of the conductive lines of the chip package structure of FIG. 4A, in accordance with some embodiments.

FIG. 4A is a cross-sectional view of a chip package structure 400, in accordance with some embodiments. As shown in FIG. 4A, the chip package structure 400 is similar to the chip package structure 300 of FIG. 3, except that the chip package structure 400 does not include the conductive line 118c of the wiring layer 118 and the conductive line 214c of the wiring layer 214, in accordance with some embodiments.

The conductive via 119f (of the conductive vias 119) passes through the dielectric layer 117, in accordance with some embodiments. The conductive via 215f (of the conductive vias 215) passes through the dielectric layer 213, in accordance with some embodiments. The conductive lines 102b and 217b are used to transmit signals, in accordance with some embodiments.

The conductive lines 102b and 217b together form a thick conductive line TC, in accordance with some embodiments. Since the thickness of the thick conductive line TC is larger than the thickness of the conductive line 102b or 217b, the horizontal resistance of the thick conductive line TC is reduced, which improves the signal transmission speed, in accordance with some embodiments.

The wiring layers 102, 118, 214 and 217, except for the conductive line 102b or 217b, together form the thick wiring layer TW, in accordance with some embodiments. The thick wiring layer TW is used for power transmission or grounding, so the thick wiring layer TW needs to have a large thickness to withstand a large current, in accordance with some embodiments.

FIG. 4B is a top view of the conductive lines 214a, 217a, 102a, and 118a of the chip package structure 400 of FIG. 4A, in accordance with some embodiments. As shown in FIGS. 4A and 4B, the wiring layers 102, 118, 214 and 217 are completely overlapped with each other, in accordance with some embodiments. As shown in FIG. 4B, for example, the conductive lines 214a, 217a, 102a, and 118a are completely overlapped with each other, in accordance with some embodiments.

Figure 5A:
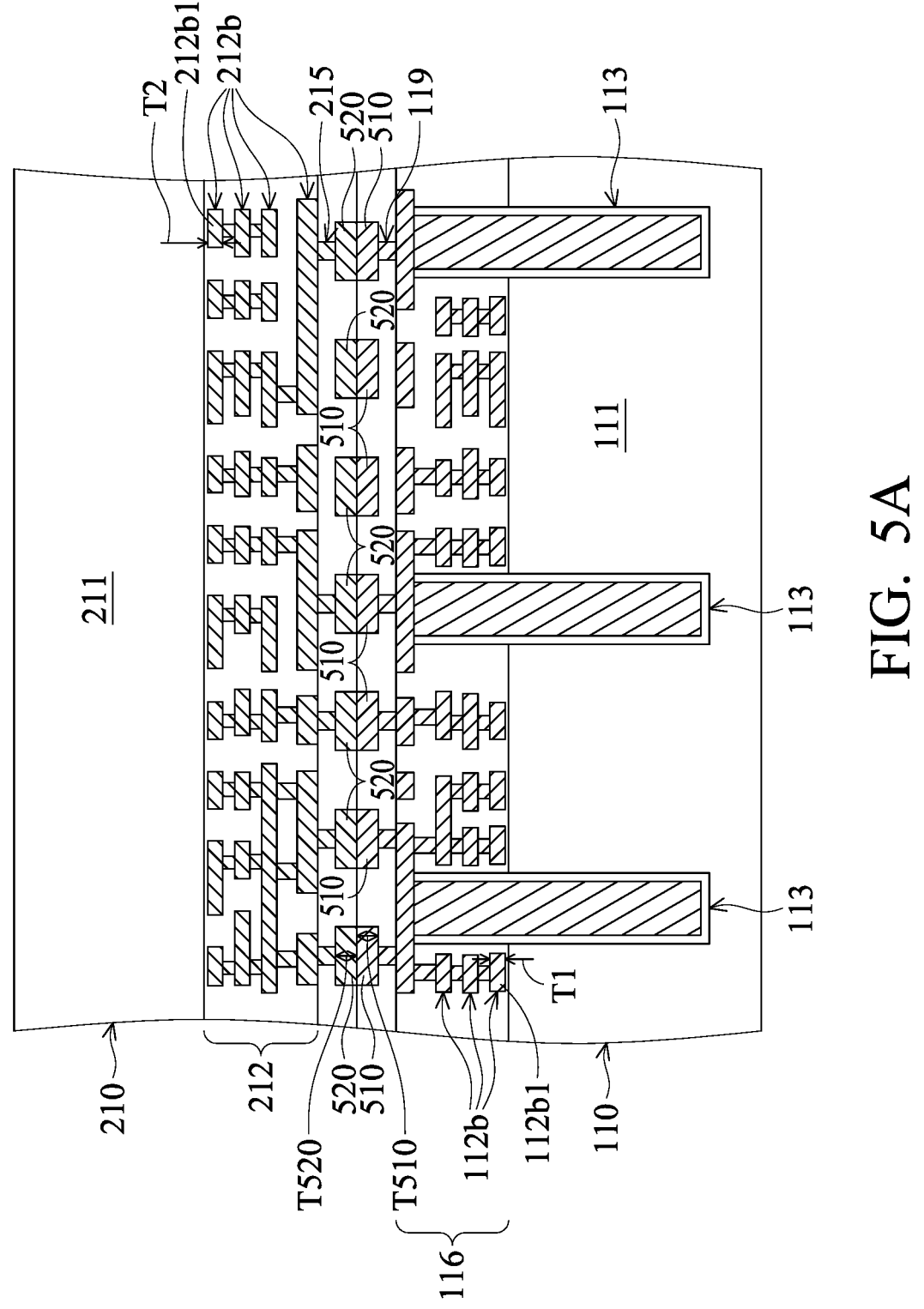
FIGS. 5A-5C are cross-sectional views of various stages of a process for forming a chip package structure, in accordance with some embodiments.
Figure 5B:
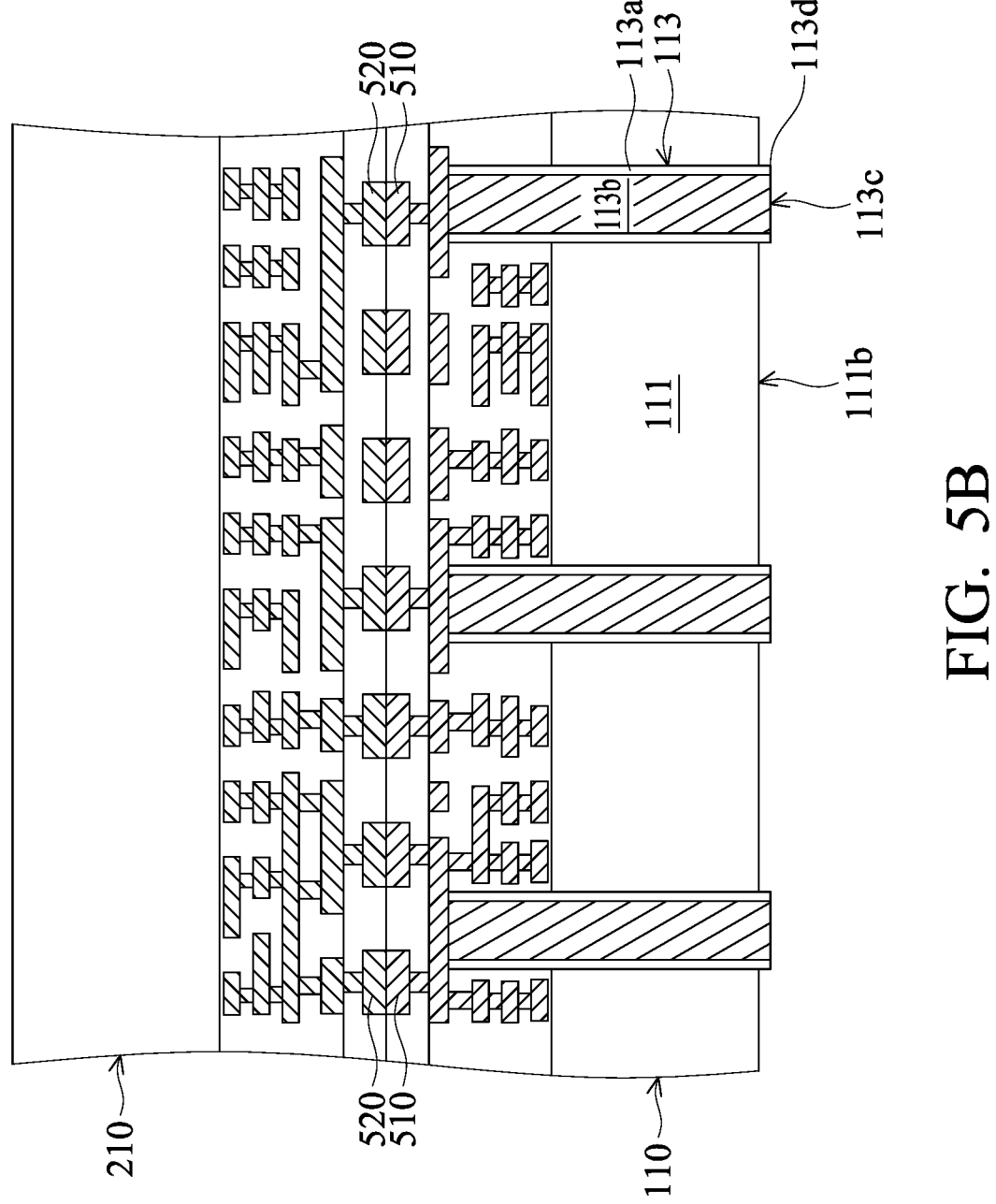
Figure 5C:
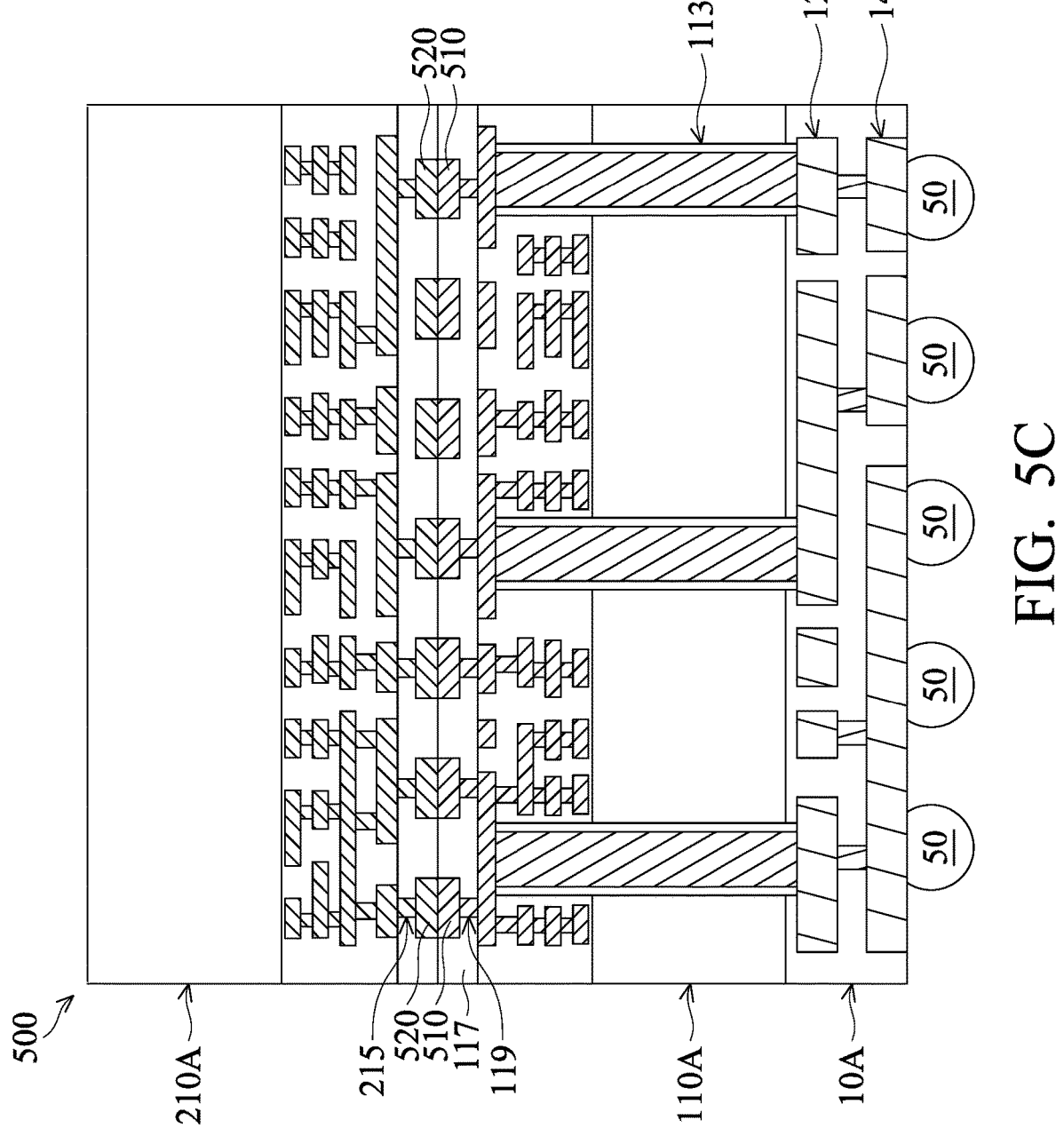

FIGS. 5A-5C are cross-sectional views of various stages of a process for forming a chip package structure, in accordance with some embodiments. The chip package structure of FIG. 5A is similar to the chip package structure of FIG. 1C, except that the chip package structure of FIG. 5A includes bonding structures 510 and 520 instead of the wiring layers 118 and 214, in accordance with some embodiments. The bonding structures 510 are in contact with the bonding structures 520 thereunder, in accordance with some embodiments.

The bonding structures 510 include bonding pads, in accordance with some embodiments. The bonding structures 520 include bonding pads, in accordance with some embodiments. The bonding structures 510 have a thickness T510 ranging from about 0.1 μm to 0.2 μm, in accordance with some embodiments. The ratio of the thickness T510 to the thickness T1 of the bottommost conductive line 112b1 of the bottommost wiring layer 112b ranges from about 1.2 to about 7, in accordance with some embodiments.

If the ratio of the thickness T510 to the thickness T1 is less than 1.2, the bonding structures 510 may be too thin and the resistance of the bonding structures 510 may be too large.

Due to the limitation of process capability, the ratio of the width to the thickness needs to be maintained within a fixed range, in accordance with some embodiments. If the ratio of the thickness T510 to the thickness T1 is greater than 7, the bonding structure 510 may be too thick and the width of the bonding structure 510 is increased, which increases the distance between the bonding structures 510, adversely affecting the signal transmission between the substrates 110 and 210, in accordance with some embodiments.

The bonding structures 520 have a thickness T520 ranging from about 0.1 μm to 0.2 μm, in accordance with some embodiments. The ratio of the thickness T520 to the thickness T2 of the conductive line 212b1 of the wiring layer 212b, which is closest to the semiconductor base 211, ranges from about 1.2 to about 7, in accordance with some embodiments.

If the ratio of the thickness T520 to the thickness T2 is less than 1.2, the bonding structures 520 may be too thin and the resistance of the bonding structures 520 may be too large. Due to the limitation of process capability, the ratio of the width to the thickness needs to be maintained within a fixed range, in accordance with some embodiments.

If the ratio of the thickness T520 to the thickness T2 is greater than 7, the bonding structure 520 may be too thick and the width of the bonding structure 520 is increased, which increases the distance between the bonding structures 520, adversely affecting the signal transmission between the substrates 110 and 210, in accordance with some embodiments.

The bonding structures 510 and 520 are made of a conductive material such as metal (e.g., aluminum, copper or tungsten) or alloy, in accordance with some embodiments.

As shown in FIG. 5B, bottom portions of the semiconductor base 111 and the conductive plugs 113 are removed, in accordance with some embodiments. The bottom portions of the dielectric layer 113a and the conductive layer 113b are removed, in accordance with some embodiments. The removal process includes a thinning process such as a planarization process (e.g., a chemical mechanical polishing process), in accordance with some embodiments.

During the removal process, the removal speed of the semiconductor base 111 may be greater than that of the conductive plugs 113. Therefore, bottom portions 113d of the conductive plugs 113 protrude from the bottom surface 111b of the semiconductor base 111 after the removal process, in accordance with some embodiments. As a result, the bottom surface 113c of the conductive plug 113 is lower than the bottom surface 111b of the semiconductor base 111, in accordance with some embodiments.

As shown in FIG. 5C, the steps of FIGS. 1E and 1F are performed to form the chip package structures 500, in accordance with some embodiments. The chip package structure 500 includes the redistribution layer 10A, the substrate 110A, the substrate 210A, and the conductive bumps 50, in accordance with some embodiments. The chip package structure 500 is similar to the chip package structure 100 of FIG. 1F, except that the chip package structure 500 includes the bonding structures 510 and 520 instead of the wiring layers 118 and 214, in accordance with some embodiments.

The conductive line 12 of the redistribution layer 10A is thicker than the bonding structure 510 or 520, in accordance with some embodiments. The conductive bonding layer 14 of the redistribution layer 10A is thicker than the bonding structure 510 or 520, in accordance with some embodiments.

Figure 6A:
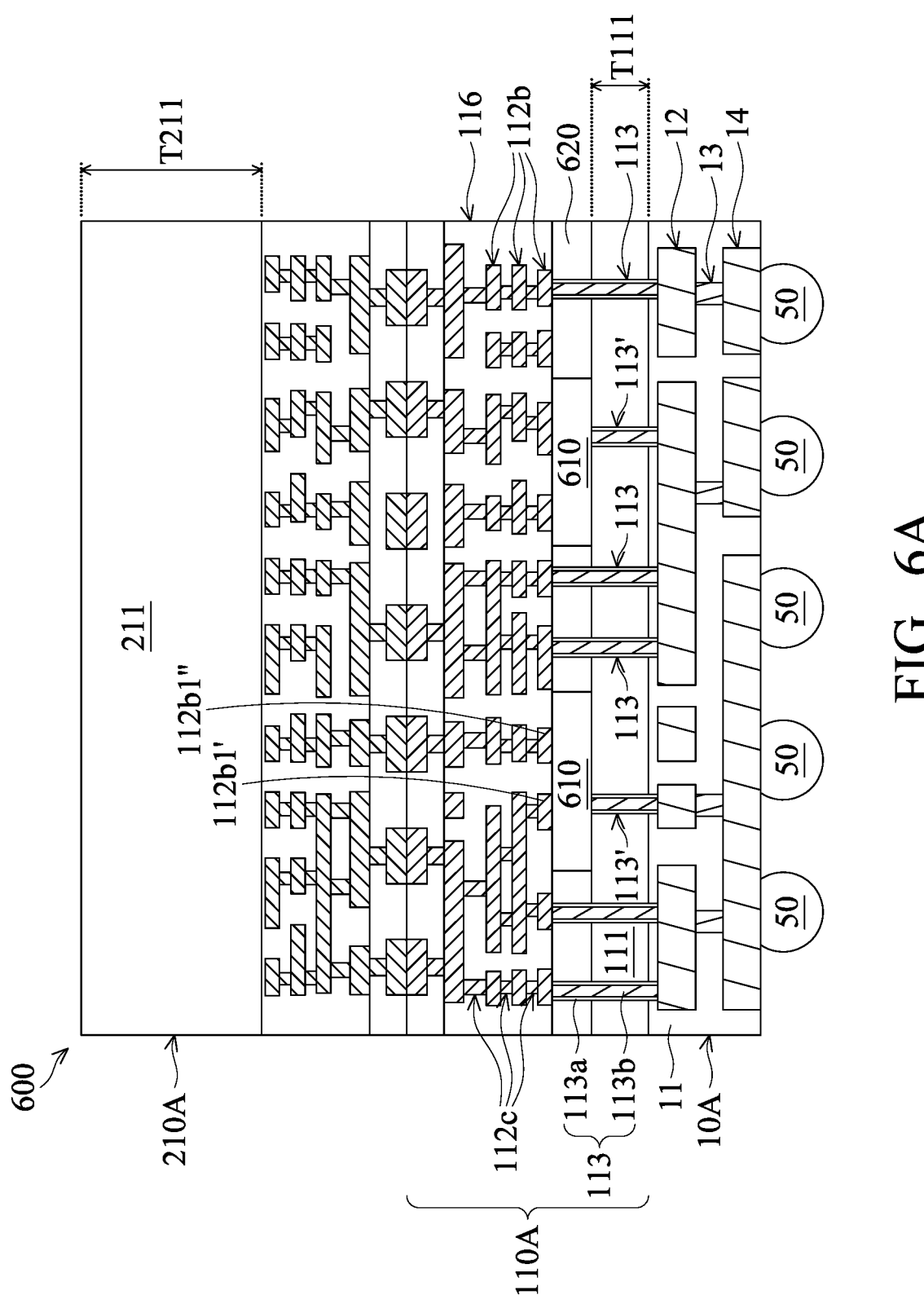
FIG. 6A is a cross-sectional view of a chip package structure, in accordance with some embodiments.

FIG. 6A is a cross-sectional view of a chip package structure 600, in accordance with some embodiments. As shown in FIG. 6A, the chip package structure 600 is similar to the chip package structure 100 of FIG. 1F, except that the semiconductor base 111 is thinner than the semiconductor base 211 of the chip package structure 600, in accordance with some embodiments. That is, the thickness T111 of the semiconductor base 111 is less than the thickness T211 of the semiconductor base 211, in accordance with some embodiments.

Furthermore, the chip package structure 600 further includes devices 610 and a dielectric layer 620, in accordance with some embodiments. The devices 610 and the dielectric layer 620 are between the semiconductor base 111 and the interconnect structure 116, in accordance with some embodiments.

Figure 6B:
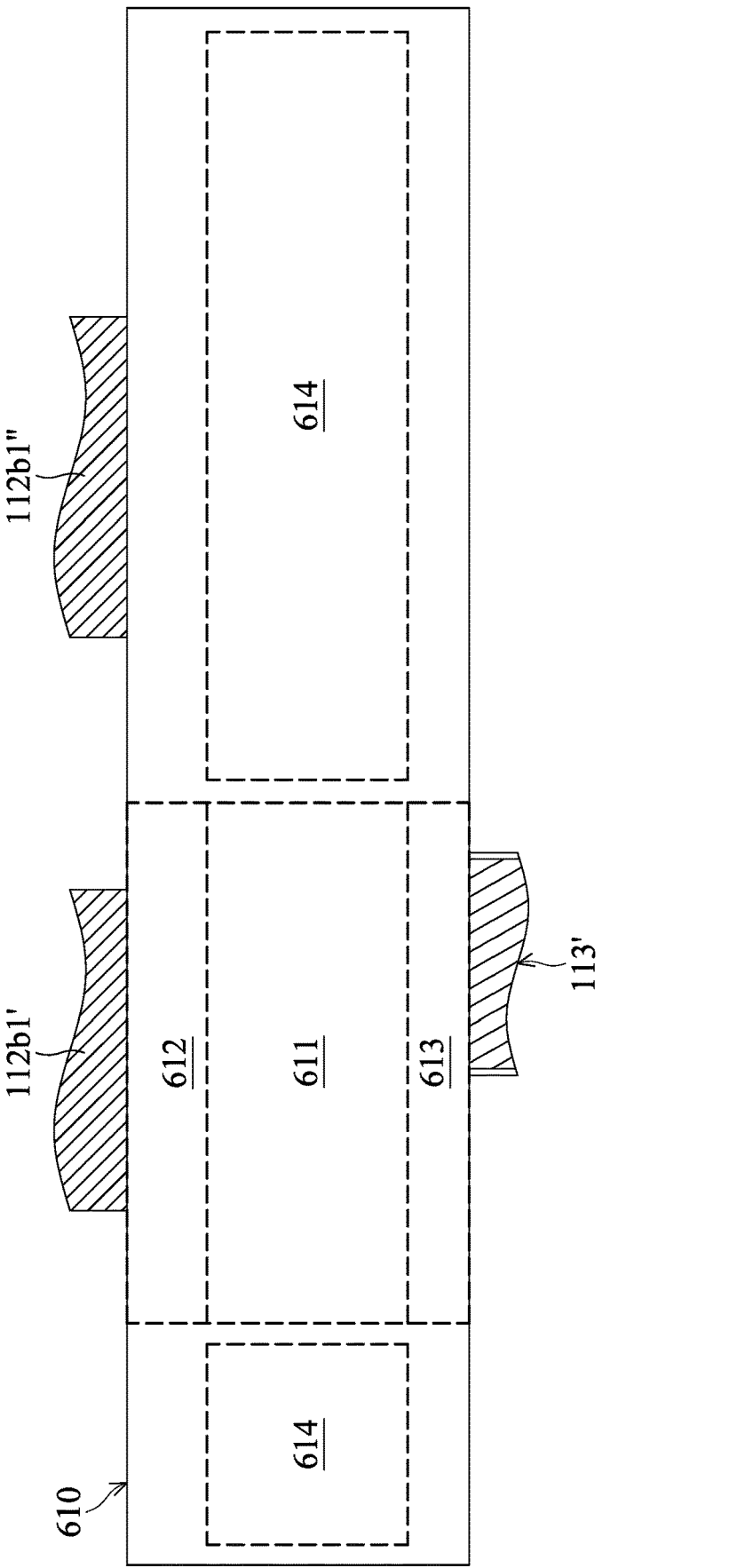
FIG. 6B is a schematic diagram of the device, the conductive lines, and the conductive plug of the chip package structure of FIG. 6A, in accordance with some embodiments.

FIG. 6B is a schematic diagram of the device 610, the conductive lines 112b1' and 112b1", and the conductive plug 113' of the chip package structure 600 of FIG. 6A, in accordance with some embodiments. As shown in FIGS. 6A and 6B, the device 610 includes a GAA (Gate-All-Around) structure transistor, in accordance with some embodiments.

The device 610 includes a channel region 611, a source/drain region 612, a source/drain region 613, and a gate region 614, in accordance with some embodiments. The channel region 611 is connected between the source/drain regions 612 and 613, in accordance with some embodiments.

The gate region 614 laterally surrounds the channel region 611, in accordance with some embodiments. The conductive lines 112b1' and 112b1" and the conductive plug 113' are electrically connected to the source/drain region 612, the gate region 614, and the source/drain region 613 respectively, in accordance with some embodiments.

The channel region 611 includes nanostructures such as nanosheets or nanowires, in accordance with some embodiments. The channel region 611 is made of an elementary semiconductor material including silicon or germanium in a single crystal, polycrystal, or amorphous structure, in accordance with some embodiments.

The source/drain regions 612 and 613 are made of a semiconductor material (e.g., silicon germanium) with P-type dopants, such as the Group IIIA element, in accordance with some embodiments. The Group IIIA element includes boron or another suitable material.

In some other embodiments, the source/drain regions 612 and 613 are made of a semiconductor material (e.g., silicon) with N-type dopants, such as the Group VA element, in accordance with some embodiments. The Group VA element includes phosphor (P), antimony (Sb), or another suitable Group VA material. The source/drain regions 612 and 613 are formed using an epitaxial process, in accordance with some embodiments.

The gate region 614 includes a gate dielectric layer, a work function metal layer, and a gate electrode layer, in accordance with some embodiments. The gate dielectric layer is made of a high-K material, such as $HfO_2$, $ZrO_2$, $HfZrO_2$, or $Al_2O_3$. The gate dielectric layer is formed using an atomic layer deposition process or another suitable process.

The work function metal layer is conformally formed over the gate dielectric layer, in accordance with some embodiments. The work function metal layer is made of titanium-containing material (e.g., TiN or TiSiN) or tantalum-containing material (e.g., TaN), or another suitable conductive material. The work function metal layer is formed using an atomic layer deposition process or another suitable process.

The gate electrode layer is formed over the work function metal layer, in accordance with some embodiments. The gate electrode layer is made of W, Co, Al, or another suitable conductive material. The gate electrode layer is formed using an atomic layer deposition process or another suitable process.

The dielectric layer 620 is made of a dielectric material such as an oxide-containing material (e.g., silicon oxide), an oxynitride-containing material (e.g., silicon oxynitride), a low-k material, a porous dielectric material, glass, or a combination thereof, in accordance with some embodiments.

The glass includes borosilicate glass (BSG), phosphoric silicate glass (PSG), borophosphosilicate glass (BPSG), fluorinated silicate glass (FSG), or a combination thereof, in accordance with some embodiments.

Figure 7:
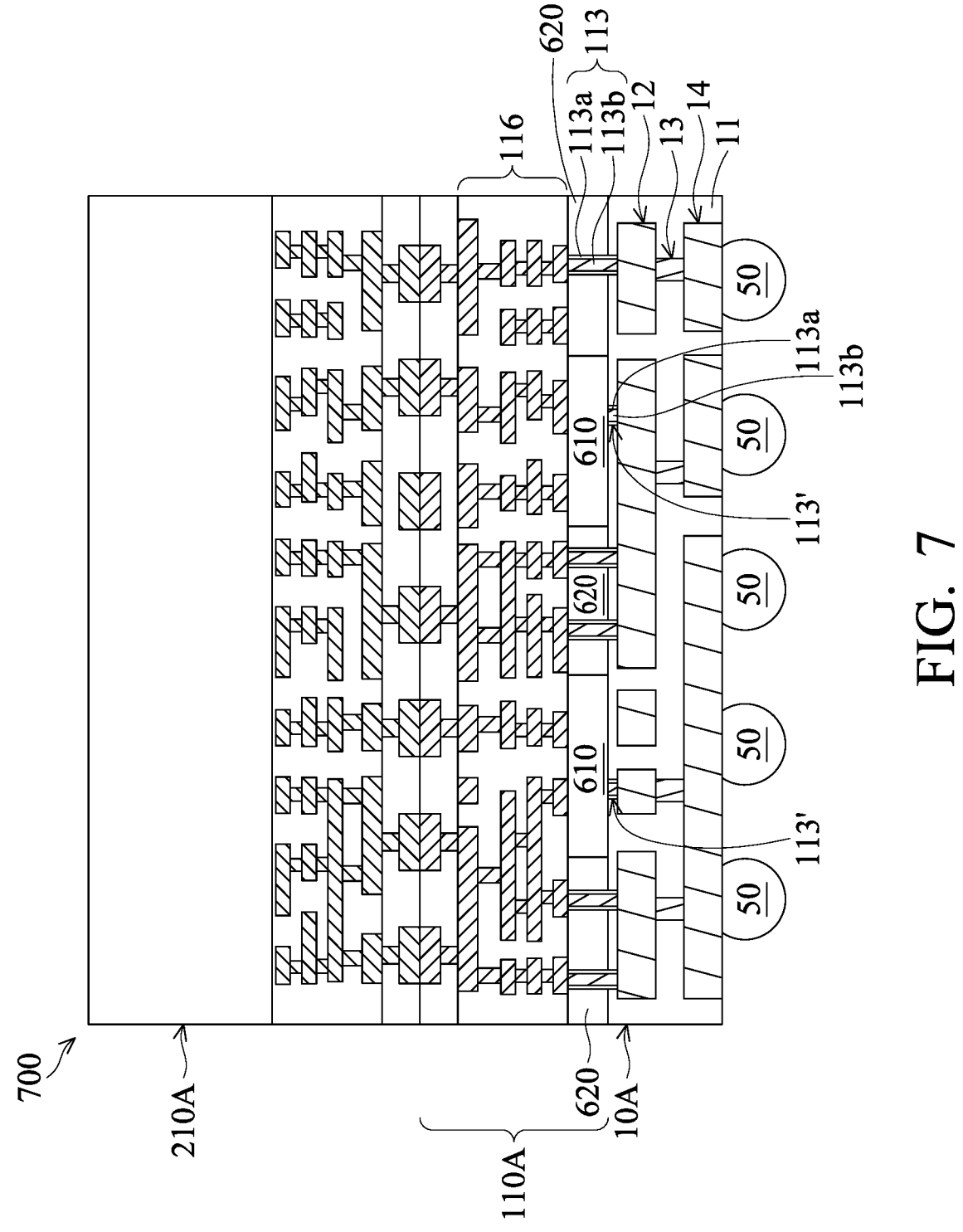
FIG. 7 is a cross-sectional view of a chip package structure, in accordance with some embodiments.

FIG. 7 is a cross-sectional view of a chip package structure 700, in accordance with some embodiments. As shown in FIG. 7, the chip package structure 700 is similar to the chip package structure 600 of FIG. 6, except that the chip package structure 700 does not have the semiconductor base 111, in accordance with some embodiments. That is, the semiconductor base 111 is completely removed during the formation process, in accordance with some embodiments.

Processes and materials for forming the semiconductor device structures 200, 300, 400, 500, 600, and 700 may be similar to, or the same as, those for forming the semiconductor device structure 100 described above. Elements designated by the same or similar reference numbers as those in FIGS. 1A to 7 have the same or similar structures and the materials. Therefore, the detailed descriptions thereof will not be repeated herein.

In accordance with some embodiments, chip package structures and methods for forming the same are provided. The methods (for forming the chip package structures) bond a first substrate to a second substrate through a first wiring layer of the first substrate and a second wiring layer of the second substrate. The first wiring layer and the second wiring layer together form a thick wiring layer with a low horizontal resistance, which improves the signal transmission speed and the performance of the chip package structures.

The methods form a thick and low-density wiring layer under the first substrate rather than over the first substrate, which prevents the thick and low-density wiring layer from occupying the space above the first substrate. Therefore, the space above the first substrate can accommodate more thin and high-density wiring layers, which improves the signal transmission speed between the first substrate and the second substrate.

In accordance with some embodiments, a method for forming a chip package structure is provided. The method includes providing a first substrate and a second substrate. The first substrate includes a first semiconductor base and a first bonding line over a front surface of the first semiconductor base, and the second substrate includes a second semiconductor base and a second bonding line over the second semiconductor base. The method includes bonding the second substrate to the first substrate. The first bonding line is in contact with the second bonding line. The method includes forming a conductive line over a back surface of the first semiconductor base. The conductive line is thicker than the first bonding line. The method includes forming a conductive bump over the back surface of the first semiconductor base. The conductive line is between the conductive bump and the first semiconductor base.

In accordance with some embodiments, a method for forming a chip package structure is provided. The method includes providing a first substrate and a second substrate. The first substrate includes a first semiconductor base, a first bonding structure over a front surface of the first semiconductor base, and a conductive plug penetrating into the first semiconductor base, and the second substrate includes a second semiconductor base and a second bonding structure over the second semiconductor base. The method includes bonding the second substrate to the first substrate. The first bonding structure is in contact with the second bonding structure. The method includes forming a conductive line over a back surface of the first substrate. The conductive line is in contact with the conductive plug, and the conductive line is thicker than the first bonding structure. The method includes forming a conductive bump over the conductive line.

In accordance with some embodiments, a chip package structure is provided. The chip package structure includes a first substrate including a first semiconductor base and a first bonding line over a front surface of the first semiconductor base. The chip package structure includes a second substrate over and bonded to the first substrate. The second substrate includes a second semiconductor base and a second bonding line under the second semiconductor base, and the first bonding line and the second bonding line are between the first semiconductor base and the second semiconductor base and in contact with each other. The chip package structure includes a conductive line over a back surface of the first semiconductor base. The conductive line is thicker than the first bonding line. The chip package structure includes a conductive bump over the back surface of the first semiconductor base. The conductive line is between the conductive bump and the first semiconductor base.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a chip package structure, comprising:

providing a first substrate and a second substrate, wherein the first substrate comprises a first semiconductor base and a first bonding line over a front surface of the first semiconductor base, and the second substrate comprises a second semiconductor base and a second bonding line over the second semiconductor base, wherein a length of the first bonding line is greater than a line width of the first bonding line in a top view of the first bonding line, and the first bonding line and the second bonding line are substantially overlapped with each other in a top view of the first bonding line and the second bonding line;

bonding the second substrate to the first substrate, wherein the first bonding line is in contact with the second bonding line;

forming a conductive line over a back surface of the first semiconductor base, wherein the conductive line is thicker than the first bonding line; and forming a conductive bump over the back surface of the first semiconductor base, wherein the conductive line is between the conductive bump and the first semiconductor base.

2. The method according to claim 1, wherein the conductive line is thicker than the second bonding line.

3. The method according to claim 1, wherein a first sidewall of the first bonding line is substantially coplanar with a second sidewall of the second bonding line.

4. The method according to claim 1, wherein the first substrate further comprises a conductive via between the first bonding line and the first semiconductor base, the conductive via is in contact with first bonding line, and a length of the conductive via is greater than a line width of the conductive via in a top view of the conductive via.

5. The method according to claim 4, wherein a first longitudinal axis of the conductive via is substantially parallel to a second longitudinal axis of the first bonding line.

6. The method according to claim 1, wherein the first substrate further comprises a first conductive via and a second conductive via between the first bonding line and the first semiconductor base, and the first conductive via and the second conductive via are in contact with the first bonding line.

7. The method according to claim 1, wherein the first substrate further comprises a line under and in contact with the first bonding line, and the line and the first bonding line are substantially overlapped with each other in a top view of the line and the first bonding line.

8. The method according to claim 7, wherein the first substrate further comprises a conductive plug penetrating into the first semiconductor base, and the bonding line is electrically connected to the conductive line through the conductive plug.

9. The method according to claim 8, wherein the first bonding line extends across opposite sidewalls of the conductive plug.

10. The method according to claim 1, further comprising:

forming a bonding structure over the conductive line, wherein the bonding structure is between the conductive bump and the first semiconductor base, and the bonding structure thicker than the first bonding structure.

11. A method for forming a chip package structure, comprising:

providing a first substrate and a second substrate, wherein the first substrate comprises a first semiconductor base, a first bonding structure over a front surface of the first semiconductor base, and a conductive plug penetrating into the first semiconductor base, and the second substrate comprises a second semiconductor base and a second bonding structure over the second semiconductor base;

bonding the second substrate to the first substrate, wherein the first bonding structure is in contact with the second bonding structure;

forming a conductive line over a back surface of the first substrate, wherein the conductive line is in contact with the conductive plug, and the conductive line is thicker than the first bonding structure;

after bonding the second substrate to the first substrate and before forming the conductive line over the back surface of the first substrate, thinning the first semiconductor base; and forming a conductive bump over the conductive line.

12. The method according to claim 11, wherein the first semiconductor base of the first substrate is thinner than the second semiconductor base of the second substrate.

13. The method according to claim 11, further comprising:

after bonding the second substrate to the first substrate and before forming the conductive line over the back surface of the first substrate, removing the first semiconductor base.

14. The method according to claim 11, further comprising:

forming a bonding structure over the conductive line, wherein the bonding structure is in contact with the conductive bump and thicker than the first bonding structure.

15. The method according to claim 11, wherein the first substrate further comprises a first dielectric layer, the first bonding structure is embedded in the first dielectric layer, the second substrate further comprises a second dielectric layer, the second bonding structure is embedded in the second dielectric layer, and a first interface between the first dielectric layer and the second dielectric layer meets a second interface between the first bonding structure and the second bonding structure.

16. A method for forming a chip package structure, comprising:

providing a first substrate, wherein the first substrate comprises a first semiconductor base, a first bonding line over a front surface of the first semiconductor base, and a first dielectric layer laterally surrounding the first bonding line, wherein the first substrate further comprises a conductive via between the first bonding line and the first semiconductor base, and a length of the conductive via is greater than a line width of the conductive via in a top view of the conductive via;

providing a second substrate, wherein the second substrate comprises a second semiconductor base, a second bonding line over the second semiconductor base, and a second dielectric layer laterally surrounding the second bonding line;

bonding the second substrate to the first substrate, wherein a first interface between the first bonding line and the second bonding line is substantially aligned with a second interface between the first dielectric layer and the second dielectric layer; and forming a conductive line over a back surface of the first semiconductor base, wherein the conductive line is thicker than the first bonding line.

17. The method according to claim 16, wherein a length of the first bonding line is greater than a line width of the first bonding line in a top view.

18. The method according to claim 16, wherein a first longitudinal axis of the conductive via is substantially parallel to a second longitudinal axis of the first bonding line.

19. The method according to claim 16, wherein the first substrate further comprises a conductive plug penetrating into the first semiconductor base, and the method further comprises:

thinning the first semiconductor base to expose a surface of the conductive plug after bonding the second substrate to the first substrate.

20. The method according to claim 16, wherein the first bonding line and the second bonding line are substantially overlapped with each other in a top view of the first bonding line and the second bonding line.

* * * * *